(12) United States Patent
Ogata

(10) Patent No.: US 9,252,763 B2
(45) Date of Patent: Feb. 2, 2016

(54) SEMICONDUCTOR INTEGRATED CIRCUIT HAVING A SWITCH, AN ELECTRICALLY-CONDUCTIVE ELECTRODE LINE AND AN ELECTRICALLY-CONDUCTIVE VIRTUAL LINE

(71) Applicant: Sony Corporation, Tokyo (JP)

(72) Inventor: Hiromi Ogata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/665,662

(22) Filed: Mar. 23, 2015

(65) Prior Publication Data

US 2015/0194955 A1 Jul. 9, 2015

Related U.S. Application Data

(63) Continuation of application No. 14/263,598, filed on Apr. 28, 2014, now Pat. No. 9,058,979, which is a continuation of application No. 13/371,994, filed on Feb. 13, 2012, now Pat. No. 8,890,568, which is a (Continued)

(30) Foreign Application Priority Data

Sep. 18, 2007 (JP) ................................. 2007-241517

(51) Int. Cl.
| | |
|---|---|
| *H01L 27/02* | (2006.01) |
| *H01L 27/118* | (2006.01) |
| *H01L 25/00* | (2006.01) |
| *H03K 17/16* | (2006.01) |

(Continued)

(52) U.S. Cl.
CPC ............ *H03K 17/16* (2013.01); *H01L 27/0207* (2013.01); *H01L 27/092* (2013.01); *H03K 3/012* (2013.01); *H03K 19/0185* (2013.01); *H01L 27/11807* (2013.01)

(58) Field of Classification Search
USPC .......................... 326/37–41, 47, 101; 327/534
See application file for complete search history.

(56) References Cited

U.S. PATENT DOCUMENTS

| 6,107,869 A | 8/2000 | Horiguchi et al. |
| 6,765,429 B2 | 7/2004 | Miyagi et al. |

(Continued)

FOREIGN PATENT DOCUMENTS

| JP | 2007-535161 A | 2/2001 |
| JP | 2003-158189 | 5/2003 |

(Continued)

OTHER PUBLICATIONS

Japanese Office Action issued Mar. 31, 2015 for corresponding Japanese Application No. 2014-060442.

(Continued)

*Primary Examiner* — Dylan White
(74) *Attorney, Agent, or Firm* — Michael Best & Friedrich LLP

(57) ABSTRACT

A semiconductor integrated circuit including: a circuit block having an internal voltage line; an annular rail line forming a closed annular line around the circuit block and supplied with one of a power supply voltage and a reference voltage; and a plurality of switch blocks arranged around the circuit block along the annular rail line, the plurality of switch blocks each including a voltage line segment forming a part of the annular rail line and a switch for controlling connection and disconnection between the voltage line segment and the internal voltage line.

22 Claims, 15 Drawing Sheets

Related U.S. Application Data continuation of application No. 12/929,180, filed on Jan. 6, 2011, now Pat. No. 8,143,914, which is a continuation of application No. 12/230,098, filed on Aug. 22, 2008, now Pat. No. 7,940,080.

(51) Int. Cl.
*H01L 27/092* (2006.01)
*H03K 19/0185* (2006.01)
*H03K 3/012* (2006.01)

(56) References Cited

U.S. PATENT DOCUMENTS

| | | | |
|---|---|---|---|
| 6,900,478 B2 * | 5/2005 | Miyagi | 257/202 |
| 7,078,932 B2 | 7/2006 | Swami | |
| 7,202,700 B2 * | 4/2007 | Isono | 326/81 |
| 7,230,477 B2 | 6/2007 | Mizuno et al. | |
| 7,234,124 B2 | 6/2007 | Chen et al. | |
| 7,279,926 B2 | 10/2007 | Severson et al. | |
| 7,543,249 B2 | 6/2009 | Redorta et al. | |
| 7,696,788 B2 | 4/2010 | Ogata | |
| 7,723,867 B2 * | 5/2010 | Willingham et al. | 307/80 |
| 2005/0169042 A1 | 8/2005 | Miyagi | |
| 2005/0200383 A1 * | 9/2005 | Ogata | 326/41 |
| 2006/0093129 A1 | 5/2006 | Redorta et al. | |
| 2007/0164806 A1 * | 7/2007 | Gasper et al. | 327/389 |
| 2007/0168899 A1 * | 7/2007 | Frenkil | 716/10 |
| 2007/0241779 A1 | 10/2007 | Ogata | |
| 2008/0012424 A1 * | 1/2008 | Shin et al. | 307/28 |
| 2008/0224177 A1 * | 9/2008 | Umekita et al. | 257/207 |
| 2009/0079465 A1 | 3/2009 | Sasaki et al. | |
| 2009/0179688 A1 | 7/2009 | Igarashi et al. | |
| 2010/0123481 A1 | 5/2010 | Ogata | |

FOREIGN PATENT DOCUMENTS

| | | |
|---|---|---|
| JP | 2003-289245 A | 10/2003 |
| JP | 2005-259879 A | 9/2005 |
| JP | 2005-286083 A | 10/2005 |
| JP | 2006-141073 A | 6/2006 |
| JP | 2007-158035 A | 6/2007 |
| JP | 2007-535161 A | 11/2007 |
| WO | WO-97/38444 A1 | 10/1997 |
| WO | WO-2005/104233 A1 | 11/2005 |
| WO | WO-2006/114875 A1 | 11/2006 |

OTHER PUBLICATIONS

Japanese Office Action issued Dec. 18, 2012 for corresponding Japanese Application No. 2007-241517.

Japanese Office Action issued Jan. 21, 2014 for corresponding Japanese Application No. 2013-029163.

Japanese Office Action issued Jul. 14, 2015 for corresponding Japanese Application No. 2014-060442.

* cited by examiner 23A,23B: VOLTAGE CELL LINE
24A,24B: POWER CELL LINE
25 : CONTROL CELL LINE

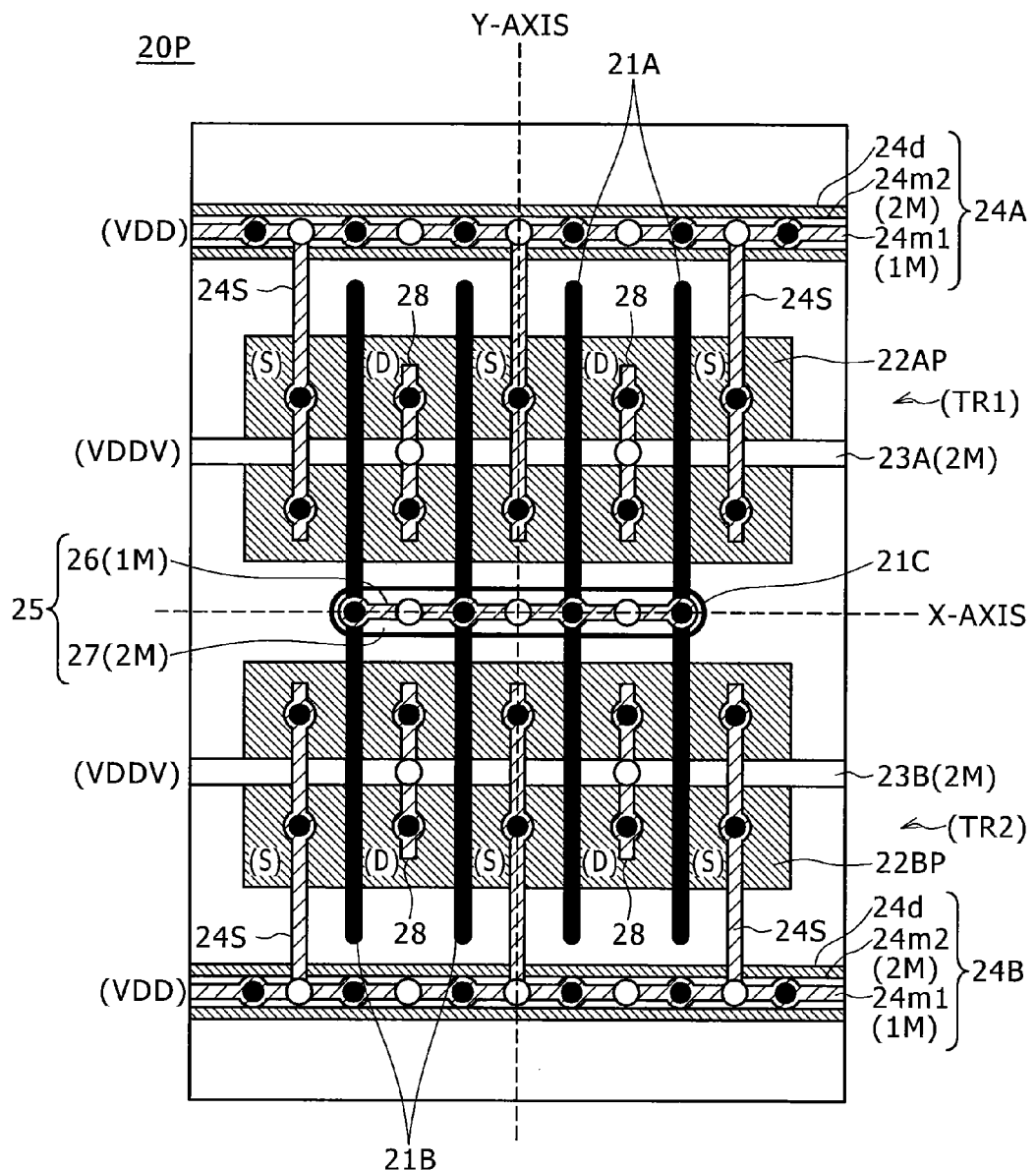

SEMICONDUCTOR INTEGRATED CIRCUIT HAVING A SWITCH, AN ELECTRICALLY-CONDUCTIVE ELECTRODE LINE AND AN ELECTRICALLY-CONDUCTIVE VIRTUAL LINE

CROSS REFERENCES TO RELATED APPLICATIONS

This is a Continuation of application Ser. No. 14/263,598, filed on Apr. 28, 2014, which is a Continuation of application Ser. No. 13/371,994, filed on Feb. 13, 2012, now U.S. Pat. No. 8,890,568, issued on Nov. 18, 2014, which is a Continuation of application Ser. No. 12/929,180, filed on Jan. 6, 2011, now U.S. Pat. No. 8,143,914, issued on Mar. 27, 2012, which is a Continuation of application Ser. No. 12/230,098, filed Aug. 22, 2008, now U.S. Pat. No. 7,940,080, issued on May 10, 2011, which claims priority from Japanese Application JP 2007-241517, filed in the Japan Patent Office on Sep. 18, 2007, the entire contents of which being incorporated herein by reference.

BACKGROUND OF THE INVENTION

1. Field of the Invention

The present invention relates to a semiconductor integrated circuit that controls, by a switch, connection and disconnection between the internal voltage line of a circuit block and wiring to which a power supply voltage or a reference voltage is applied.

2. Description of the Related Art

MTCMOS (Multi-Threshold Complementary Metal Oxide Semiconductor) technology is known as technology for controlling the shutoff of power supply to a circuit and the cancellation of the shutoff by a switch.

Generally, the threshold voltage of a transistor in a logic circuit or the like needs to be lowered as a design value in order to prevent a signal delay accompanying a decrease in power supply voltage or an element miniaturization. When the threshold voltage of a transistor in a logic circuit or the like is low, a high leakage current occurs. The MTCMOS technology prevents unnecessary consumption of power by a circuit in a stopped state by shutting off a leakage current path of the circuit in the stopped state by means of a transistor (power supply switch) having a higher threshold value than a transistor in a logic circuit or the like.

In application of the MTCMOS technology to a circuit block, internal voltage lines referred to as a so-called virtual VDD line and a so-called virtual GND line are provided within the circuit block. The internal voltage lines are connected to a global real power supply line (real VDD line) and a real reference voltage line (real VSS line) for establishing connection between blocks outside the circuit block, via a power supply switch for power shutoff and the cancellation of the shutoff.

The power supply switch is provided at three kinds of positions, that is, a position between a functional circuit that is started and stopped repeatedly and the real VDD line, a position between the functional circuit and the real VSS line, and both the positions. In general, a PMOS transistor is used as the switch on the VDD side, and an NMOS transistor is used as the switch on the VSS line side.

The starting and stopping of the functional circuit in the MTCMOS applied block is controlled by a circuit in an MTCMOS non-applied block set in an operating state at all times while supplied with power from the real VDD line and the real VSS line after the semiconductor integrated circuit is started.

Alternatively, a configuration can be adopted in which a control signal for controlling the starting and stopping of the functional circuit in the MTCMOS applied block can be input from an external terminal of the semiconductor integrated circuit.

A power supply switch can be realized by a cell within an MTCMOS applied block. More specifically, there is a case where within an MTCMOS applied block, a power supply switch is provided in each logic circuit cell of an inverter, a NAND circuit, a NOR circuit or the like, or in a functional circuit cell realized by a few logic circuits, and there is a case where a dedicated power supply switch cell without a logic circuit or a functional circuit is provided. A switch arrangement of this type will hereinafter be referred to as an "internal switch (SW) arrangement," and a semiconductor integrated circuit adopting the arrangement will hereinafter be referred to as an "internal SW arrangement type IC."

As opposed to the internal SW arrangement type IC, a semiconductor integrated circuit in which power supply switches are arranged around a circuit block as an object of power supply control is known (see Japanese Patent Laid-Open No. 2003-289245, hereinafter referred to as Patent Document 1 and Japanese Patent Laid-Open No. 2003-158189, hereinafter referred to as Patent Document 2, for example). A switch arrangement of this type will hereinafter be referred to as an "external switch (SW) arrangement," and a semiconductor integrated circuit adopting the arrangement will hereinafter be referred to as an "external SW arrangement type IC."

The external SW arrangement is suitably used in combination with a circuit block having a general-purpose circuit (for example a memory, a CPU or the like) referred to as a so-called "macro" as a part or the whole of the circuit block.

Patent Document 2 discloses a configuration in which a transistor cell (switch) is disposed on three sides or four sides of a circuit block, the switches having a shape such that the direction of length of the switches is along the respective sides and the direction of arrangement of a transistor gate line within the switches is the same as the direction of the length.

In this configuration, a VDD supply ring and a VSS supply ring are arranged as an annular line annularly enclosing the periphery of the circuit block on an opposite side (outer side) of a transistor cell arrangement region from the circuit block. The VDD supply ring and the drain of a switch transistor are connected to each other by a metal wiring layer at a level different from that of the VDD supply ring. The VSS supply ring and a VSS line within the circuit block are connected to each other by a metal wiring layer at a level different from that of the VSS supply ring. The source of the switch transistor and a virtual VSS line within the circuit block are connected to each other by a metal wiring layer at a level different from that of the VSS supply ring.

SUMMARY OF THE INVENTION

A semiconductor integrated circuit described in the above Patent Document 1 does not have a VDD voltage supply line disposed in the form of a ring around a circuit block (internal circuit). A voltage drop therefore occurs at a position of the VDD voltage supply line which position is distant from a VDD voltage supply source. As a result, even when a switch transistor of a same size as other switch transistors is turned on or off for a same time, the switch transistor has a different capability to charge or discharge an internal voltage line of the internal circuit. A device is thus necessary such that the size of the switch transistor is increased or the number of transistors is increased as the position of the switch transistor becomes more distant from the VDD voltage supply source. This results in a disadvantage of an increase in leakage current via the switch transistor in a state in which the internal circuit is stopped.

The threshold voltage of the switch transistor is set higher than the threshold voltage of a transistor in the internal circuit, so that the leakage current is relatively small. However, when a stop period is long, unnecessary power consumption due to an increase in the size of the switch transistor or the number of switch transistors may not be ignored.

The semiconductor integrated circuit described in the above Patent Document 2 has a VDD voltage supply line and a VSS voltage supply line arranged in annular form as a supply ring. The semiconductor integrated circuit described in the above Patent Document 2 therefore uniformizes a voltage drop from a voltage supply source to each switch transistor as compared with the semiconductor integrated circuit described in the above Patent Document 1 which circuit does not have the supply ring. Thus, the increase in leakage current is relatively suppressed.

However, the semiconductor integrated circuit described in the above Patent Document 2 has the annular lines (supply rings) and switch transistors arranged separately from each other, and thus has complex wiring for connecting the switch transistors and the supply rings (the VDD supply ring and the VSS supply ring) to each other.

While the VDD supply ring and the VSS supply ring are provided for a purpose of uniformizing voltage drops, the potentials of the VDD supply ring and the VSS supply ring may not be perfectly uniform as a result of being affected by an operating peripheral circuit. Of course, the potentials become more uniform by reducing the wiring resistance of these supply rings. However, the potential of the VSS supply ring, for example, in the vicinity of a peripheral circuit frequently operating with a high amplitude may be raised from a reference potential (for example 0 [V]) as a result of being affected by the peripheral circuit. It is difficult, however, to perfectly estimate the operation of the peripheral circuit. Therefore, in order to avoid the effect of the peripheral circuit and stabilize the operation of the switch transistors, a need to shift the position of a switch transistor or change the size of a switch transistor arises in a process of design, and a heavy design load of performing connection wiring again is imposed.

That is, the configuration of the switch transistor (referred to as a "macro" in Patent Document 2) described in Patent Document 2 does not have a structure ready for such a design change.

Incidentally, various examples of modification disclosed in Patent Document 2 in which examples the size of the switch transistor is changed or the switch transistor is doubly provided also clearly indicate the importance of the position and the size of the switch transistor.

A semiconductor integrated circuit according to a first embodiment of the present invention includes: a circuit block having an internal voltage line; an annular rail line forming a closed annular line around the circuit block and supplied with one of a power supply voltage and a reference voltage; and a plurality of switch blocks arranged around the circuit block along the annular rail line, the plurality of switch blocks each including a voltage line segment forming a part of the annular rail line and a switch for controlling connection and disconnection between the voltage line segment and the internal voltage line.

In the present invention, preferably, the plurality of switch blocks have the voltage line segment and the switch internally connected to each other, and positional relation of end sides of the voltage line segment at two opposed sides of a block frame is set identical in the plurality of switch blocks.

In the present invention, preferably, the plurality of switch blocks are standardized by having an identical size and including four different kinds of switch blocks for four respective sides of the circuit block.

Alternatively, preferably, for the plurality of switch blocks, a number of switch blocks arranged on each side of the circuit block is determined such that the number of switch blocks is increased as impedance of wiring supplying one of the power supply voltage and the reference voltage to the circuit block as viewed from each of the four sides of the circuit block is decreased.

In the present invention, preferably, a wiring part of the annular rail line which wiring part is parallel with one pair of opposed sides of four sides of the circuit block and a wiring part of the annular rail line which wiring part is parallel with another pair of opposed sides of the four sides of the circuit block are formed by wiring layers at different levels.

In the present invention, preferably, in each of the switch blocks, the voltage line segment is disposed in one of states of intersecting and being in proximity to an arrangement region of the switch, a buffer circuit operating receiving voltage supplied from the voltage line segment is formed on an opposite side of the arrangement region of the switch and the voltage line segment from the circuit block, a first control line segment to which a control signal is input via a control line is disposed on an input side of the buffer circuit, and a second control line segment electrically connected to a control node of the switch is disposed on an output side of the buffer circuit.

Further, preferably, a direction of length of a gate of a transistor as the switch is made identical within the plurality of switch blocks.

A semiconductor integrated circuit according to a second embodiment of the present invention includes: a circuit block having an internal voltage line; a first annular rail line forming a closed annular line around the circuit block and supplied with one of a power supply voltage and a reference voltage; a second annular rail line forming a closed annular line around the circuit block and connected to the internal voltage line at a plurality of positions between the first annular rail line and the circuit block; and a plurality of switch blocks arranged around the circuit block along the first annular rail line and the second annular rail line, the plurality of switch blocks each including a first voltage line segment forming a part of the first annular rail line, a second voltage line segment forming a part of the second annular rail line, and a switch connected between the first voltage line segment and the second voltage line segment.

In the present invention, preferably, mutual positional relation between the first voltage line segment, the second voltage line segment, and the switch is uniform in the plurality of switch blocks.

In the present invention, preferably, positional relation of end sides of the first voltage line segment and the second voltage line segment at two opposed sides of a block frame is set identical in the plurality of switch blocks.

According to the constitution of the first embodiment described above, a switch block is formed including a voltage line segment forming a part of an annular rail line and a switch, and a plurality of such switch blocks are arranged around a circuit block. Therefore, mutual positional relation between the annular rail line and the switch is uniform in the plurality of switch blocks.

Two voltage line segments are connected to each other by making switch blocks adjoin each other, or when the switch blocks are at a distance from each other, wiring is connected between the two voltage line segments, whereby a closed annular rail line is formed around the circuit block.

According to the constitution of the second embodiment described above, two annular rail lines referred to as a first annular rail line and a second annular rail line are formed.

Thus, each of a plurality of switch blocks includes a first voltage line segment forming a part of the first annular rail line and a second voltage line segment forming a part of the second annular rail line. A switch is connected between the first voltage line segment and the second voltage line segment. In this case, preferably, mutual positional relation between the first annular rail line, the second annular rail line, and the switch is uniform in the plurality of switch blocks.

Therefore, first voltage line segments are connected to each other and second voltage line segments are connected to each other by making switch blocks adjoin each other, or when the switch blocks are at a distance from each other, connection is established between the corresponding voltage line segments by wiring, whereby two closed annular rail lines are formed around a circuit block.

When a switch block is to be moved, constituent elements other than the voltage line segment of the switch block to be moved are moved to a desired position, and the constituent elements are connected to the annular rail line at the position to which the constituent elements have been moved.

At this time, in the first embodiment, a change in connection to the circuit block can be necessary. However, when each switch block has a part of the first annular rail line and a part of the second annular rail line as in the second embodiment, in particular, a change in connection to the circuit block is not necessary. Thus, by merely moving constituent elements other than the first voltage line segment and the second voltage line segment of a switch block on each of the first annular rail line and the second annular rail line, the switch block can be moved freely on the power supply line rails.

The above is a description of effects in moving a switch. Also in a case of switch insertion or deletion, it similarly suffices to insert or delete a necessary number of constituent elements other than the voltage line segments (or the first voltage line segments and the second voltage line segments) of switch blocks at necessary positions.

According to the embodiment of the present invention, in moving a switch or changing the number of switches, it suffices principally to change constituent elements other than the voltage line segment of the switch block. Therefore benefits are obtained in that it is easy to make a design change and it is easy to optimize the position and the number of switches. More specifically, in a case where a power supply voltage supply line or a reference voltage supply line is separated from the switches and there is no uniformity in mutual positional relation between the supply line and the switches, metal wiring layers at different levels need to be connected to each other again in making a design change such as the moving of a switch, the insertion or deletion of a switch or the like. On the other hand, the present invention eliminates a need for connecting every piece of such wiring other than the annular rail line again.

BRIEF DESCRIPTION OF THE DRAWINGS

FIG. 12 is a schematic layout diagram of another switch cell according to the embodiment;

DETAILED DESCRIPTION OF THE PREFERRED EMBODIMENTS

Preferred embodiments of the present invention will hereinafter be described with reference to the drawings.

<General Configuration>

Figure 1:
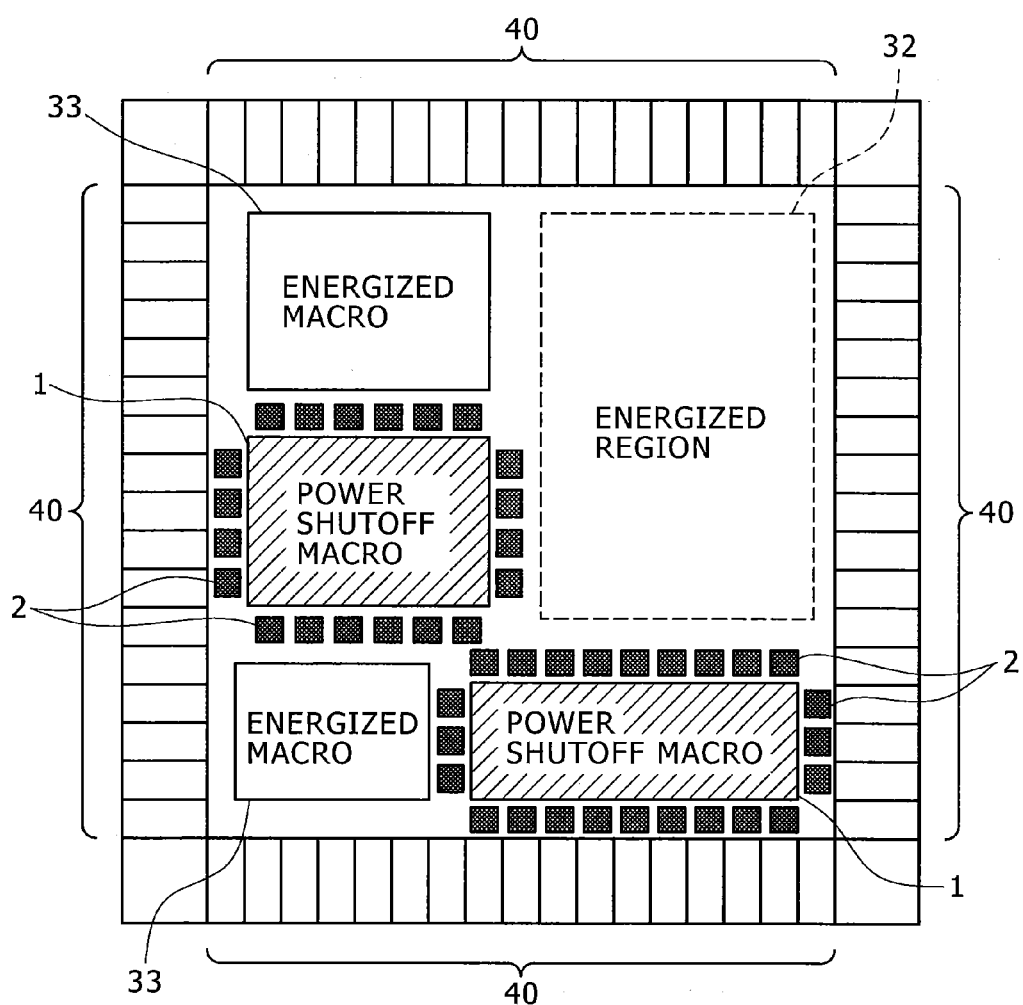
FIG. 1 is a block diagram showing a general configuration of a semiconductor integrated circuit according to an embodiment of the present invention.

FIG. 1 shows a general configuration of a semiconductor integrated circuit according to an embodiment of the present invention.

In FIG. 1, a plurality of input-output cells 40 are respectively arranged so as to form a column along four sides of a rectangular semiconductor chip on which the semiconductor integrated circuit is formed.

A few circuit blocks are arranged in a chip area for circuit arrangement which area is surrounded on all four sides by the input-output cells 40 shown in FIG. 1. In the example shown in FIG. 1, a basic configuration of the semiconductor integrated circuit which configuration is referred to as an "energized region," for example an energized circuit block 32 including a CPU, a register, a memory, a power supply circuit and the like is disposed in the chip area. The energized circuit block 32 corresponds to a circuit block to which the MTCMOS technology is not applied. The energized circuit block 32 operates by being supplied with a power supply voltage VDD and a reference voltage VSS at all times after the semiconductor integrated circuit is started.

A large number of circuit blocks referred to as "macros" and including, in a part thereof or the whole thereof, a general-purpose circuit individually designed so as to be also usable in other semiconductor integrated circuits are further arranged in the chip area for circuit arrangement. The "macros" can be designed by outsourcing, and can be purchased from other companies as IP (Intellectual Property).

The circuit blocks as "macros" can be roughly classified into non-applied circuit blocks 33 referred to as "energized macros" to which the MTCMOS technology is not applied and which operate by being supplied with the power supply voltage VDD and the reference voltage VSS at all times after the semiconductor integrated circuit is started as with the energized circuit block 32 and power shutoff object circuit blocks 1 referred to as "power shutoff macros" to which the MTCMOS technology is applied and power to which is shut off as demanded.

Incidentally, the energized circuit block 32, the non-applied circuit blocks 33, and the power shutoff object circuit blocks 1 arranged in the chip area surrounded by the input-output cells 40 have a pair of a real VDD line and a real VSS line arranged therein, which are not shown in FIG. 1, and are thereby supplied with power. More specifically, some of the input-output cells 40 are assigned for power supply, and a pair of real power supply lines is arranged from the input-output cells 40 for power supply in each of a row direction and a column direction within the chip area. Thereby power supply wiring of the energized circuit block 32, the non-applied circuit blocks 33, and the power shutoff object circuit blocks 1 is formed.

The power shutoff object circuit blocks 1 are of the so-called "external SW arrangement type," with switches controlling power shutoff and connection being arranged around the power shutoff object circuit blocks 1. As shown in FIG. 1, a predetermined number of switch blocks 2 including the switches are arranged around the power shutoff object circuit blocks 1.

Though not shown in FIG. 1, an annular rail line to which the power supply voltage VDD or the reference voltage VSS is applied is arranged in such a manner as to be superimposed on the plurality of switch blocks 2 arranged around the power shutoff object circuit blocks 1. At least one annular rail line or preferably two annular rail lines are provided. An arrangement relation between the annular rail line and the switch blocks 2 will be described in the following with reference to drawings.

As described above, in the MTCMOS technology, a switch transistor is provided at three kinds of positions, that is, a position between a functional circuit that is started and stopped repeatedly and a real VDD line, a position between the functional circuit and a real VSS line, and both the positions. In general, a PMOS transistor is used as a switch on the VDD side, and an NMOS transistor is used as a switch on the VSS line side.

A switch transistor in the present embodiment may be provided at any of the three kinds of positions described above. However, providing a switch transistor on both of the VDD side and the VSS side leads to a great disadvantage of an increase in area occupied by the switch transistors considering effect of providing the switch transistors on both of the VDD side and the VSS side. Therefore a switch transistor is desirably provided on one of the VDD side and the VSS side. In addition, the NMOS transistor has a higher driving power per unit gate width than the PMOS transistor. Therefore, more desirably, a switch transistor is provided on the VSS side.

Hence, the following description supposes the provision of a switch (transistor) on the VSS side.

Figure 2:
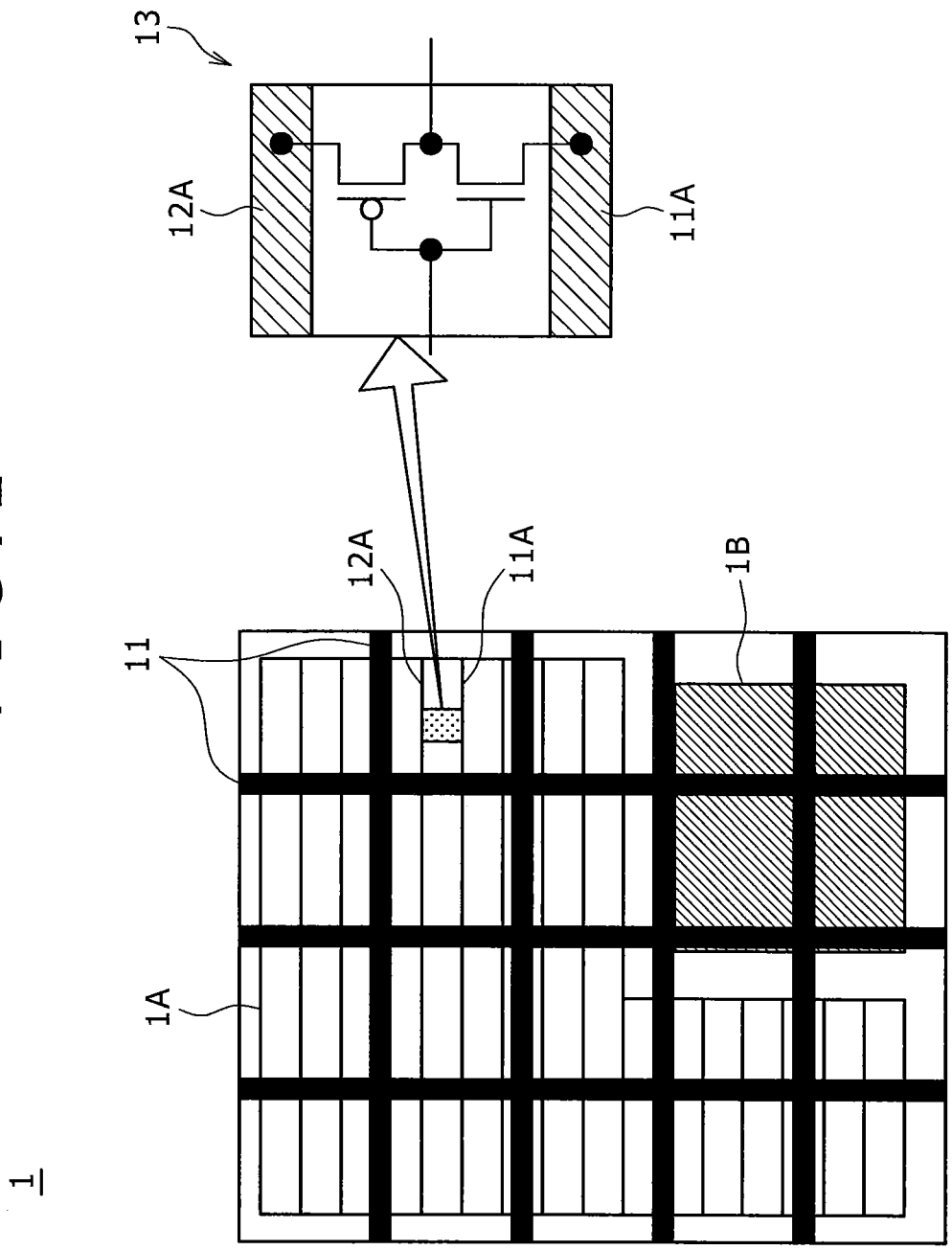
FIG. 2 is a diagram of internal configuration of a power shutoff object circuit block according to the embodiment.

FIG. 2 shows an example of internal configuration of a power shutoff object circuit block 1.

In the illustrated example of configuration, the inside of the power shutoff object circuit block 1 is divided into a standard cell arrangement region 1A in which a functional circuit is realized by a standard cell and a macro cell region 1B of a RAM, for example. Incidentally, for application of the present invention, a "circuit block" as an object for power shutoff control does not need to have a macro, and may be formed by only a standard cell arrangement region 1A.

Internal voltage lines 11 that are referred to as so-called "virtual VSS lines" and to which the reference voltage VSS is applied are arranged in parallel with each other in each of a row direction and a column direction on the standard cell arrangement region 1A and the macro cell region 1B. The internal voltage lines 11 in the row direction and the internal voltage lines 11 in the column direction are formed by a wiring layer at a level higher than that of the cells, and are interconnected at intersections thereof.

On the other hand, though not shown to avoid complexity, power supply lines that are referred to as a so-called "real VDD line" and to which the power supply voltage VDD is applied and power supply lines to which the reference voltage VSS is applied are similarly arranged in the form of a lattice.

In the standard cell arrangement region 1A, a plurality of branch lines 11A extend in the row direction at predetermined intervals from column direction trunk wiring of the internal voltage lines 11 as "virtual VSS lines." In addition, in the standard cell arrangement region 1A, a plurality of branch lines 12A extend in the row direction at predetermined intervals from column direction trunk wiring of the voltage supply lines as "real VDD lines" not shown in FIG. 2.

FIG. 2 shows one inverter cell 13 in an enlarged state, the inverter cell 13 representing standard cells. The inverter cell 13 has a VSS line segment forming a part of a branch line 11A and a VDD line segment forming a part of a branch line 12A. A PMOS transistor and an NMOS transistor are connected in series with each other between the two segments. The gates of the PMOS transistor and the NMOS transistor are both connected to an input signal line. A node between the PMOS transistor and the NMOS transistor is connected to an output signal line. The input signal line and the output signal line are formed by signal line segments within the inverter cell 13 and adjacent cells. However, an input and an output line of the whole of the standard cell arrangement region 1A are formed by a wiring layer (not shown) at a higher level.

<First Example of Rail Arrangement>

Figure 3:
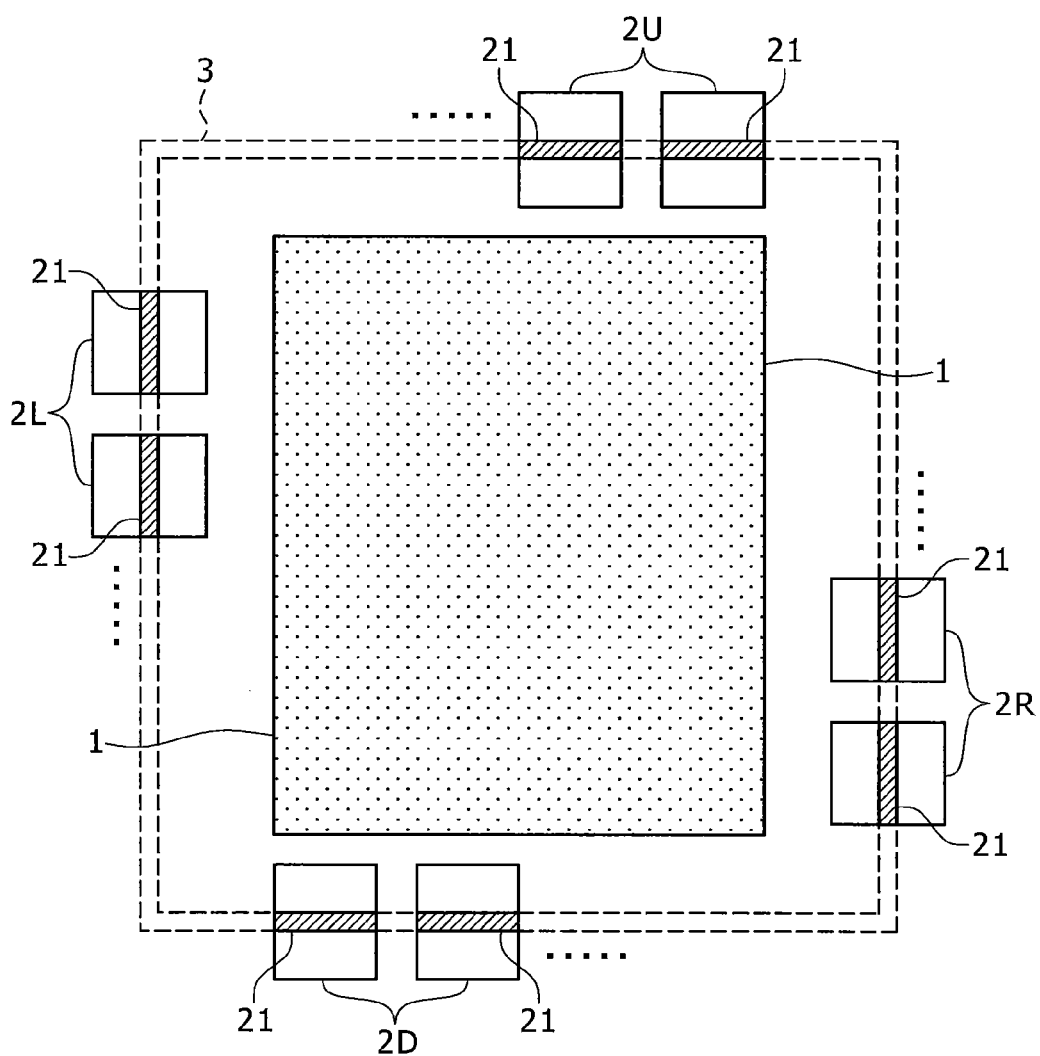
FIG. 3 is a diagram showing a first example of rail arrangement of the embodiment.

FIG. 3 shows a first example of rail arrangement.

As illustrated in FIG. 3, a plurality of switch blocks 2 are arranged so as to surround a power shutoff object circuit block 1 in proximity to the four sides of the power shutoff object circuit block 1. In this case, for convenience, the switch blocks 2 are classified into upper switch blocks 2U, lower switch blocks 2D, right switch blocks 2R, and left switch blocks 2L for the respective sides of the power shutoff object circuit block 1. The upper switch blocks 2U have a same configuration; the lower switch blocks 2D have a same configuration; the right switch blocks 2R have a same configuration; and the left switch blocks 2L have a same configuration.

The four kinds of switch blocks 2U, 2D, 2R, and 2L each have a voltage line segment 21 and a switch not shown in FIG. 3.

The voltage line segment 21 is represented by a broken line in FIG. 3. The voltage line segment 21 is a wiring part forming a part of an annular rail line 3 that forms a closed annular line around the power shutoff object circuit block 1.

In a state of design of arrangement wiring, the annular rail line 3 is disposed and connected to switches and the like at a wiring stage after the switches are arranged. After the annular rail line 3 is once disposed and connected, constituent elements (including a switch) other than a voltage line segment 21 are moved in a unit of a switch block 2U, 2D, 2R, or 2L, and the switch and the like are connected to the annular rail line 3 at a position after the moving. Incidentally, in FIG. 3, connection wiring for connection between an internal voltage line 11 (see FIG. 2) within the power shutoff object circuit block 1 and the switch needs to be changed each time the switch block is moved. However, the trouble of changing connection wiring for connecting the annular rail line 3 to the switch is saved, and it is correspondingly easy to move the switch.

Similarly, in a case of inserting switch blocks, a necessary number of switch blocks are inserted at necessary positions with constituent elements other than voltage line segments 21 within the switch blocks as units, and switches and the like are connected to the annular rail line 3 at the positions.

Similarly, in a case of deleting a switch, the switch is deleted with constituent elements other than a voltage line segment 21 within the switch block as a unit.

Even in inserting or deleting a switch, the trouble of changing connection wiring for connecting the annular rail line 3 to the switch is saved, and it is correspondingly easy to move the switch.

<Second Example of Rail Arrangement>

Figure 4:
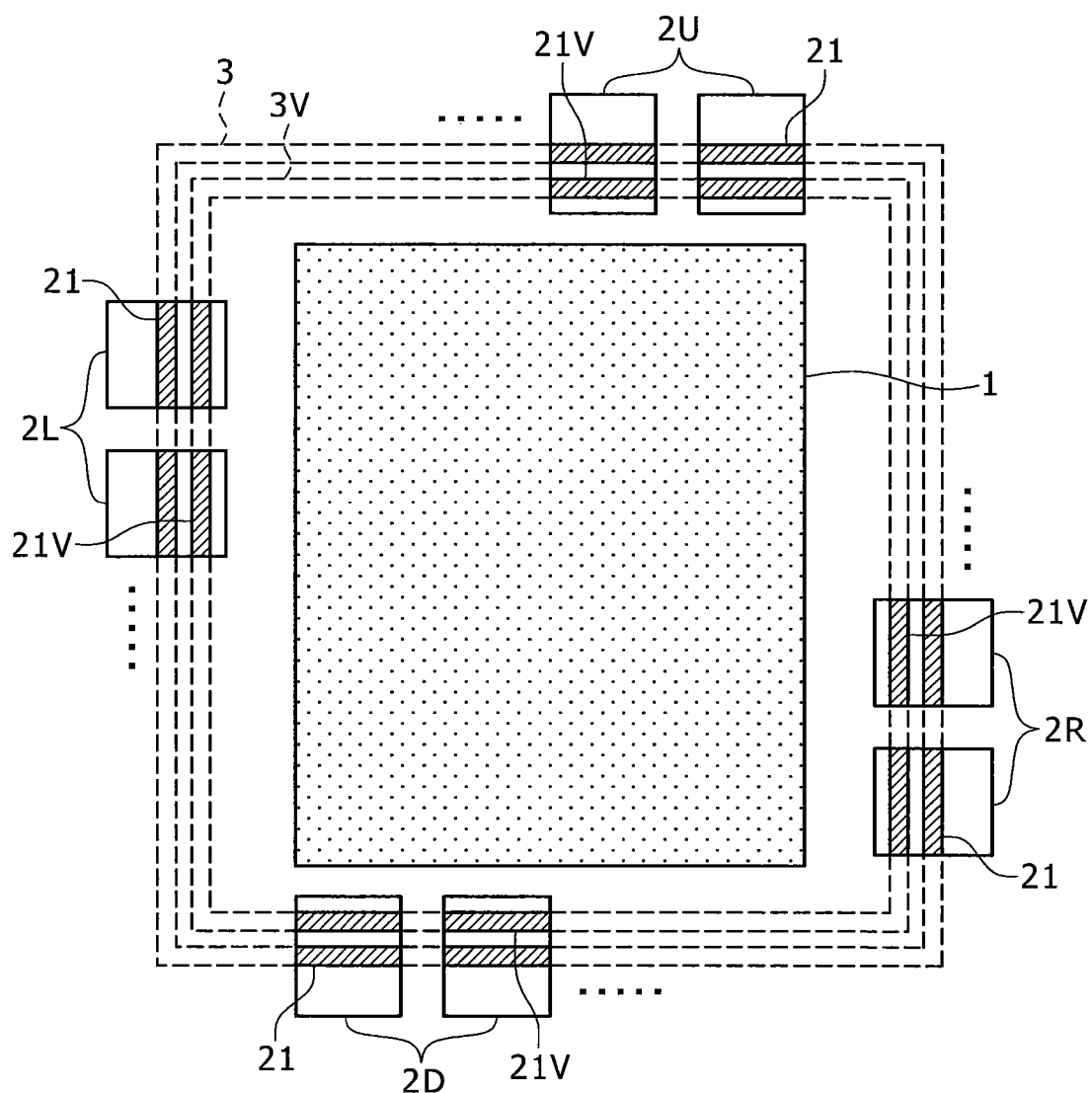
FIG. 4 is a diagram showing a second example of rail arrangement of the embodiment.

FIG. 4 shows a second example of rail arrangement.

As a first difference of the example of arrangement shown in FIG. 4 from FIG. 3, a virtual annular rail line 3V as a "second annular rail line" is provided in addition to an annular rail line 3 as a "first annular rail line."

The virtual annular rail line 3V is disposed in parallel with the annular rail line 3 between the annular rail line 3 and the power shutoff object circuit block 1. The virtual annular rail line 3V is connected to predetermined positions of internal voltage lines 11 (see FIG. 2) within the power shutoff object circuit block 1, for example each end part (three positions in the row direction and four positions in the column direction) of the internal voltage lines 11 in the case of FIG. 2.

In each of switch blocks 2U, 2D, 2R, and 2L, a switch not shown in the figure is connected between the annular rail line 3 (voltage line segment 21) and the virtual annular rail line 3V (virtual voltage line segment 21V).

As a second difference, in each of the switch blocks 2U, 2D, 2R, and 2L, a virtual voltage line segment 21V as a "second voltage line segment" is provided in parallel with a voltage line segment 21 as a "first voltage line segment."

The other arrangement itself of the switch blocks 2U, 2D, 2R, and 2L with respect to the power shutoff object circuit block 1 is the same as in FIG. 3.

In the second example of rail arrangement, as in the first example of rail arrangement, constituent elements other than the voltage line segment 21 and the virtual voltage line segment 21V of a switch block are only moved, inserted, or deleted. The trouble of changing connection wiring for connecting the annular rail line 3 to the switch is saved, and it is correspondingly easy to move the switch.

Further, in the second example of rail arrangement, the virtual annular rail line 3V is connected to each end part (three positions in the row direction and four positions in the column direction) of the internal voltage lines 11, for example. The trouble of changing connection wiring for connecting the virtual annular rail line 3V to the switch is also saved with no change made to the connection positions, and it is correspondingly easy to move the switch.

As already described, in the first example of rail arrangement (FIG. 3) and the second example of rail arrangement (FIG. 4) described above, the position and the number of switch blocks can be changed freely by only moving, inserting, or deleting constituent elements excluding the voltage line segment 21 (and the virtual voltage line segment 21V) of the above-described switch block.

In order to enable this free design change, it is necessary that the switch blocks 2U, 2D, 2R, and 2L have a same size and that end side positions of voltage line segments 21 (and virtual voltage line segments 21V) at two opposed sides of block frames of the switch blocks 2U, 2D, 2R, and 2L which opposed sides are crossed by the annular rail line 3 (and the virtual annular rail line 3V) be standardized (fixed).

Incidentally, when the end side positions are not standardized, the pattern of the annular rail line 3 (and the virtual annular rail line 3V) needs to be corrected such that end side positions are connected to each other between adjacent switch blocks after constituent elements excluding the voltage line segment 21 (and the virtual voltage line segment 21V) of a switch block are moved along the annular rail line 3 (and the virtual annular rail line 3V), inserted, or deleted. However, this work is a simple operation of connecting end sides and can thus be automated. Thus, switch arrangement is changed much more easily than in a case of manually performing again connection wiring connecting switches to an annular line disposed outside the switches using a wiring layer at another level after arranging the switches.

<Switch Control Line>

Though not shown in FIG. 3 or FIG. 4, a plurality of switch control lines may be arranged, depending on the number of switch groups controlled simultaneously.

Figure 5:
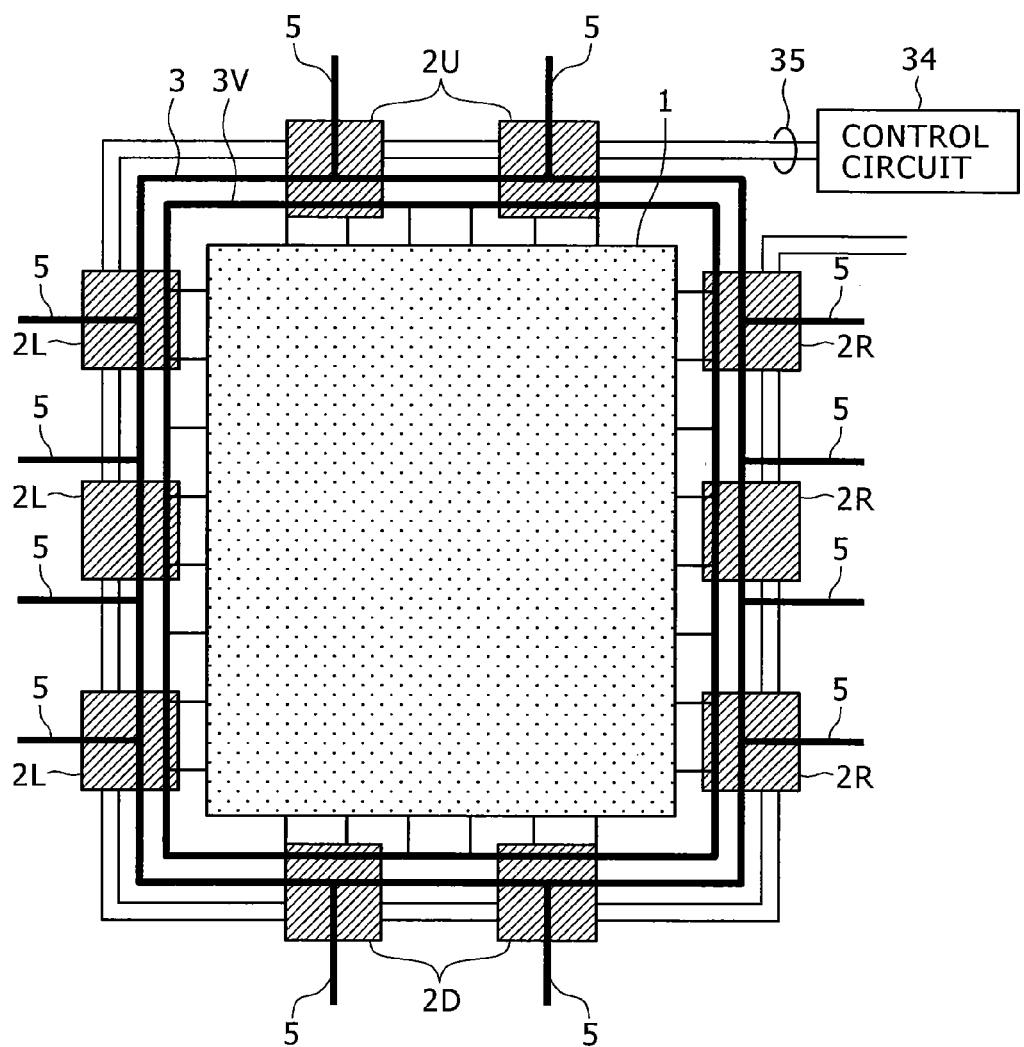
FIG. 5 is a diagram showing a circuit block and a control line routed to switch blocks around the circuit block in the embodiment.

FIG. 5 is a diagram showing an example of arrangement of two control lines. In this case, the second example of rail arrangement (FIG. 4) is adopted for annular rail lines.

A control circuit 34 shown in FIG. 5 is for example provided in an MTCMOS non-applied circuit block such as the energized circuit block 32 or the non-applied circuit blocks 33 in FIG. 1. The control circuit 34 can thereby operate at all times while supplied with power after the semiconductor integrated circuit is started. A control line 35 from the control circuit 34 is routed to upper switch blocks 2U, left switch blocks 2L, lower switch blocks 2D, and right switch blocks 2R in this order, and a control signal is applied in this order. The control signal controls the conduction and non-conduction of a switch within each switch block.

Figure 6:
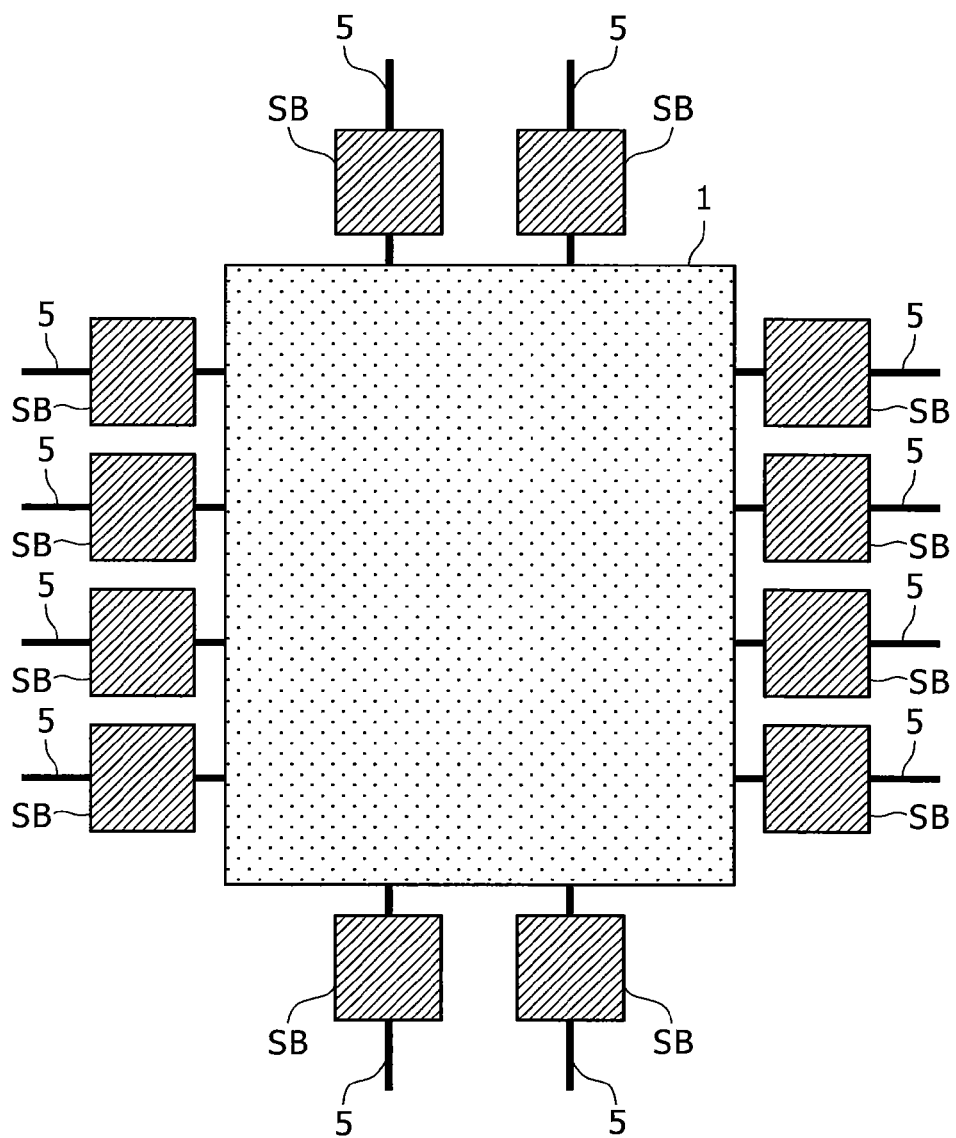
FIG. 6 is a block diagram showing a configuration without an annular rail line.

Incidentally, the configuration shown in FIG. 5 is provided with branches of real VSS wiring at predetermined positions of an annular rail line 3 so as to be usable as a replacement for a configuration without an annular rail line which configuration is shown in FIG. 6.

In the external SW arrangement configuration shown in FIG. 6 to which the present invention is not applied, pieces of global real VSS wiring 5 provided in the form of a lattice are connected to a power shutoff object circuit block 1 via switch blocks SB.

The annular rail line 3 shown in FIG. 5 is connected to real VSS wiring 5 arranged in the form of a lattice at two positions in the row direction and four positions in the column direction.

On the other hand, a virtual annular rail line 3V is connected to a power shutoff object circuit block 1 at six positions in the row direction and eight positions in the column direction.

These connection positions do not need to be changed at all when a switch block 2U, 2D, 2R, or 2L is moved, inserted, or deleted.

A more detailed switch configuration in an example in which switch control is performed by two control lines 35 will next be described with reference to a drawing.

<Switch Configuration Example>

Figure 7:
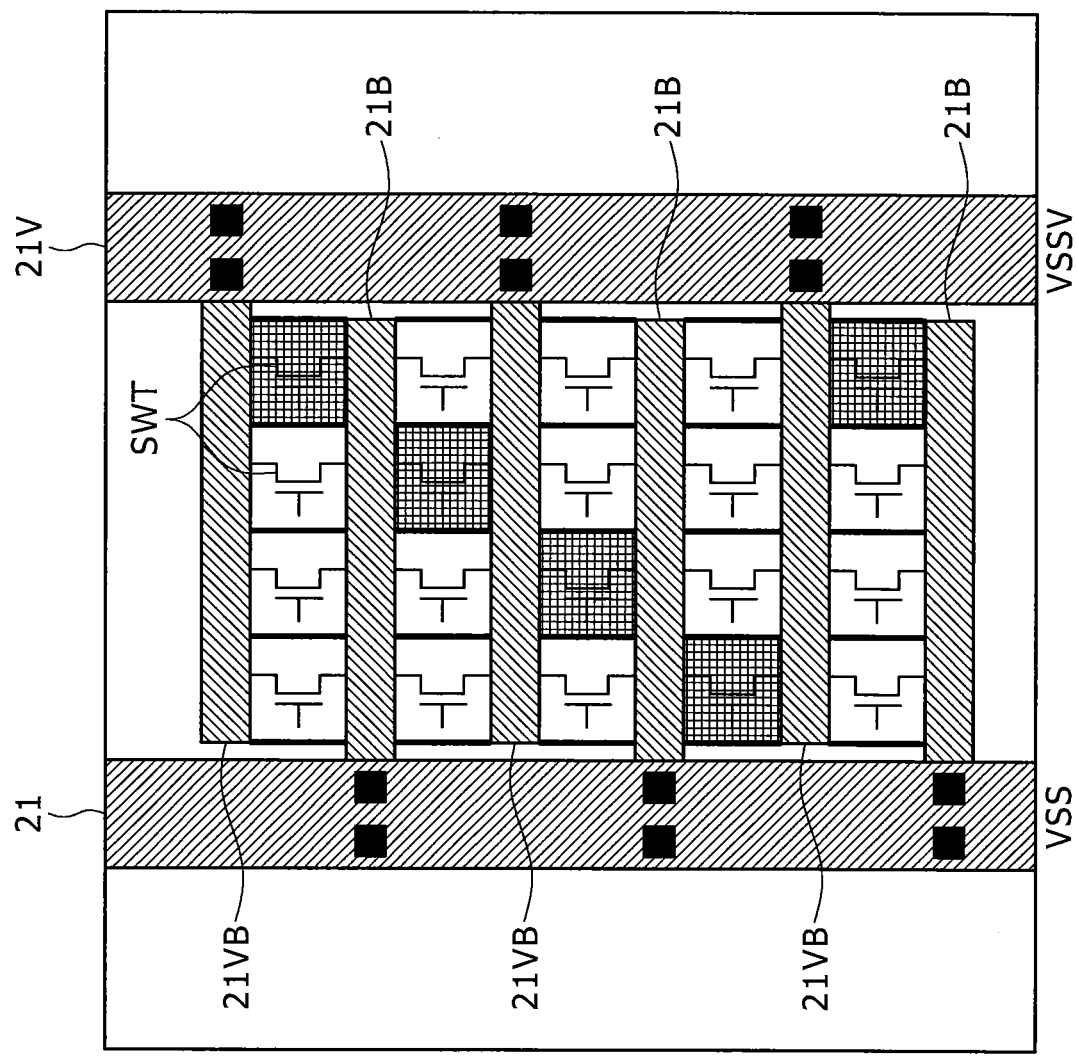
FIG. 7 is a diagram schematically showing an arrangement of switch transistors in the embodiment.

FIG. 7 is a switch block configuration diagram schematically showing an arrangement of switch transistors between a voltage line segment 21 to which the reference voltage VSS (for example 0 [V]) is applied and a virtual voltage line segment 21V maintained at a virtual reference voltage VSSV.

In FIG. 7, three branch lines 21B are provided to the voltage line segment 21, and three branch lines 21VB are provided to the virtual voltage line segment 21V. The branch lines 21B and the branch lines 21VB are arranged alternately with each other. Four switch transistors SWT are connected in parallel with each other between one branch line 21B and one branch line 21VB adjacent to the branch line 21B. Five stages of such switch transistor strings are provided, and a total of 4×5=20 switch transistors SWT are arranged in the form of a matrix.

One control line not shown in FIG. 7 controls the conduction and non-conduction of one switch transistor SWT in each stage or a total of five switch transistors SWT of the 20 switch transistors SWT. The circuit symbol parts of the five switch transistors SWT are shown with a dark mesh in FIG. 7. The other 15 switch transistors SWT not provided with the mesh are simultaneously controlled by another control line.

A part of the switches and the other switches are thus controlled separately from each other in order to suppress variations in potential of the voltage line segment 21 (annular rail line 3) due to sudden switching when power supply is started to return from a stopped state in which power supply to the power shutoff object circuit block 1 (see FIGS. 1 to 5) is shut off to an operating state. Thus, control is performed such that a small number of switch transistors SWT or the five switch transistors SWT in this case are turned on first to lower the potential of the virtual voltage line segment 21V (internal voltage lines 11 within the power shutoff object circuit block 1) to a certain degree by a relatively high on resistance, and when the potential of the virtual voltage line segment 21V is stabilized, the other 15 switch transistors SWT are turned on. Thereby, the peak value of a potential rise (power supply noise) of the reference voltage VSS transmitted from the annular rail line 3 to the real VSS wiring 5 is suppressed to such a level as not to affect other circuits operating at all times.

Figure 8A:
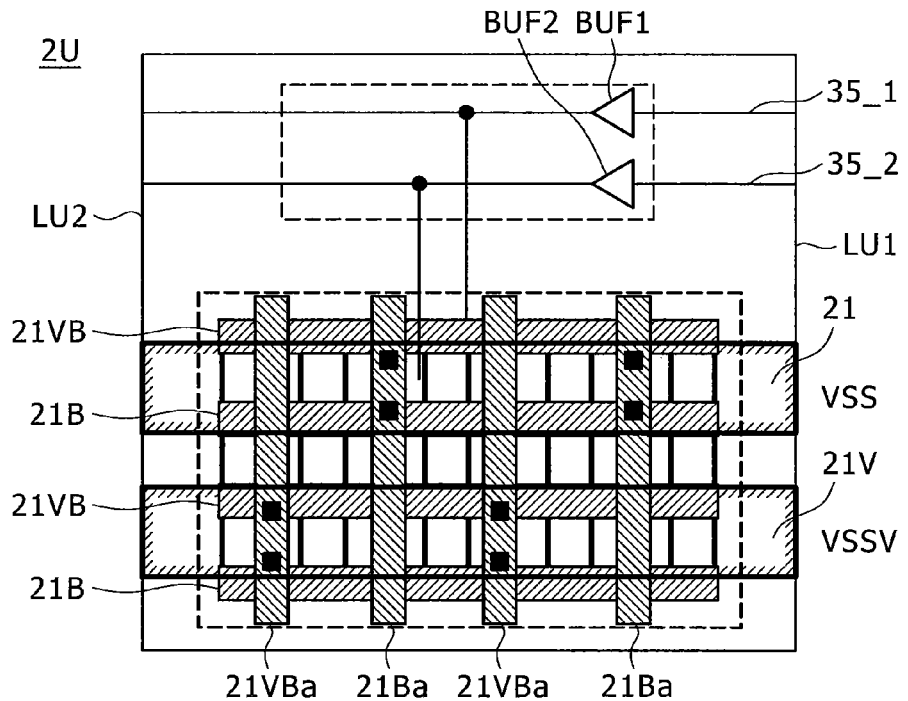
FIGS. 8A and 8B relate to the embodiment, FIG. 8A being a diagram of a configuration of an upper switch block, and FIG. 8B being a diagram of a configuration of a lower switch block.
Figure 8B:
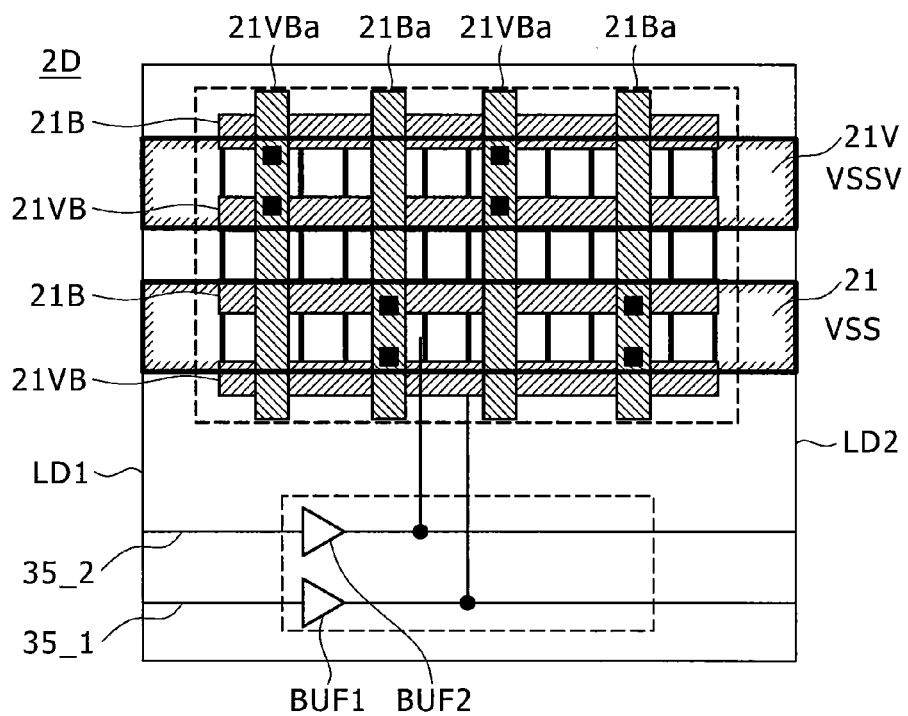
Figure 9A:
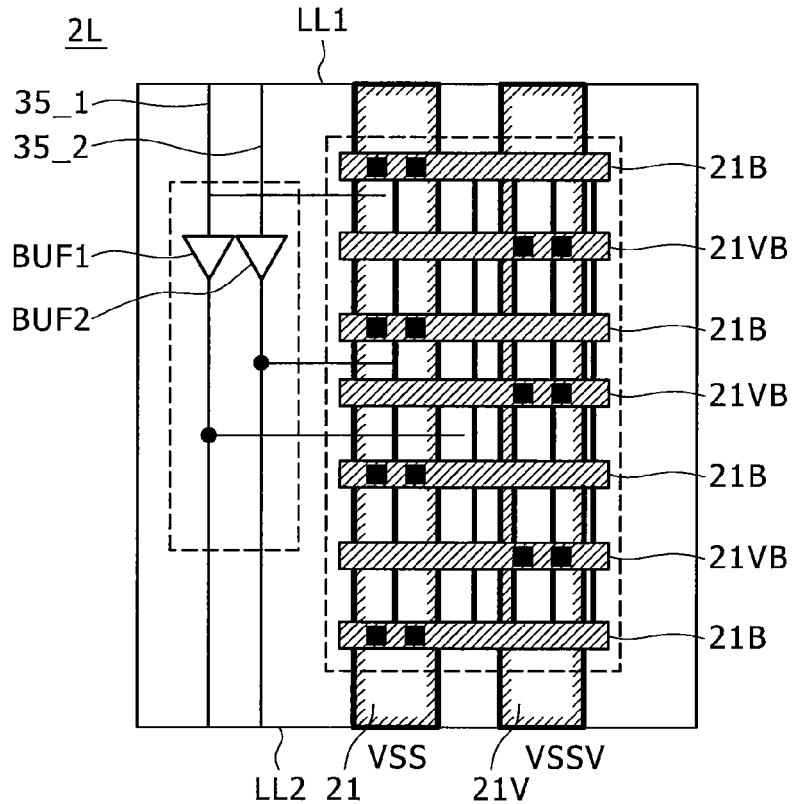
FIGS. 9A and 9B relate to the embodiment, FIG. 9A being a diagram of a configuration of a left switch block, and FIG. 9B being a diagram of a configuration of a right switch block.
Figure 9B:
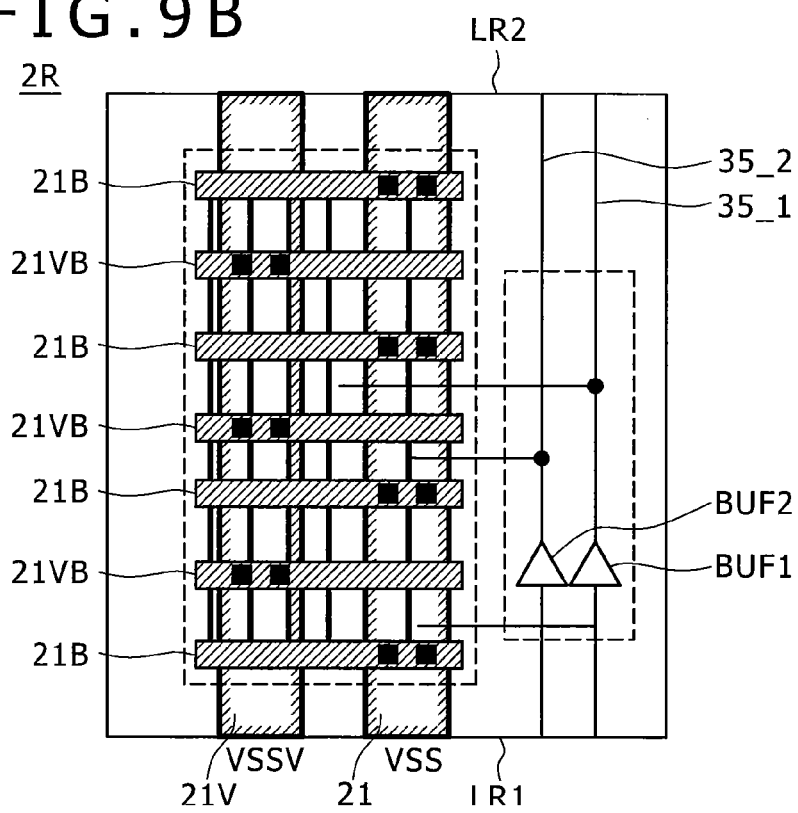

FIGS. 8A to 9B show an example of an arrangement within an actual switch block. In terms of correspondence with FIG. 3 and FIG. 4, FIG. 8A shows an upper switch block 2U, FIG. 8B shows a lower switch block 2D, FIG. 9A shows a left switch block 2L, and FIG. 9B shows a right switch block 2R.

The four kinds of switch blocks 2U, 2D, 2R, and 2L have a same size. In this case, the sides (hereinafter referred to as connection sides) of a block frame at which sides the reference voltage VSS, the virtual reference voltage VSSV, and the control signal are input and output, that is, sides LU1 and LU2 in FIG. 8A, sides LD1 and LD2 in FIG. 8B, sides LL1 and LL2 in FIG. 9A, and sides LR1 and LR2 in FIG. 9B are set at a same length. In addition, the respective end sides of a voltage line segment 21, a virtual voltage line segment 21V, a first switch control line 35_1, and a second switch control line 35_2 are standardized at same positions at any of these connection sides.

In this case, the first switch control line 35_1 controls a number of switch transistors SWT controlled first as in FIG. 7, and the second switch control line 35_2 controls a number of other switch transistors SWT.

Unlike FIG. 7, the switch blocks 2U, 2D, 2R, and 2L shown in FIGS. 8A and 8B and FIGS. 9A and 9B have the voltage line segment 21 and the virtual voltage line segment 21V arranged in parallel with each other in such a manner as to be superimposed above a switch arrangement region enclosed by a broken line. This provides an advantage of reducing an area occupied by the blocks. However, an arrangement in which the voltage line segment 21 and the virtual voltage line segment 21V are not superimposed above a switch arrangement region as in FIG. 7 can also be adopted.

When the voltage line segment 21 and the virtual voltage line segment 21V are arranged in parallel with each other in such a manner as to be superimposed above the switch arrangement region, the first switch control line 35_1 and the second switch control line 35_2 may not be arranged in the switch arrangement region with a limited number of layers of multilayer wiring structure. Hence, in the present example, the first switch control line 35_1 and the second switch control line 35_2 are disposed outside the switch arrangement region on an outer side opposite from the power shutoff object circuit block 1.

The left switch block 2L and the right switch block 2R shown in FIGS. 9A and 9B have six switch cells as shown in FIG. 7 in an X-direction (horizontal direction of the figures) and six switch cells as shown in FIG. 7 in a Y-direction (vertical direction of the figures), that is, a total of 36 switch cells arranged therein.

On the other hand, while the upper switch block 2U and the lower switch block 2D shown in FIGS. 8A and 8B have a total of 36 switch cells, which number is the same as in FIGS. 9A and 9B, the upper switch block 2U and the lower switch block 2D have 12 switch cells arranged in the X-direction and three switch cells arranged in the Y-direction.

The reason is that a switch cell has a large size in the Y-direction as compared with that in the X-direction, and that to meet a need to make the direction of length of gate electrodes the same Y-direction in FIGS. 8A and 8B and FIGS. 9A and 9B, horizontal-to-vertical ratios of switch arrangement regions contained within switch blocks having the same size are adjusted to the vertical size and the horizontal size of the switch blocks, the vertical size and the horizontal size of the switch blocks being interchanged in FIGS. 8A and 8B and FIGS. 9A and 9B.

In the case of FIGS. 9A and 9B, the voltage line segment 21 and the virtual voltage line segment 21V each intersect all branch lines 21B and 21VB. Thus, the voltage line segment 21 can be connected to all the branch lines 21B and 21VB in a lower layer via contacts, and the virtual voltage line segment 21V can be connected to all the branch lines 21B and 21VB in the lower layer via contacts.

In the case of FIGS. 8A and 8B, on the other hand, the voltage line segment 21 and the virtual voltage line segment 21V do not intersect all the lower layer wiring (branch lines 21B and 21VB) to which to provide contacts. Thus, as shown in FIGS. 8A and 8B, in the upper switch block 2U and the lower switch block 2D, access branch lines 21Ba orthogonal to the voltage line segment 21 and the branch lines 21B need to be provided in an access path from the voltage line segment 21 to the branch lines 21B. The access branch lines 21Ba are formed by a wiring layer lower than the voltage line segment 21 and higher than the branch lines 21B. Thus, a two-stage branch structure is adopted in which the branch lines of the voltage line segment 21 are the access branch lines 21Ba and further the branch lines 21B branch off from the access branch lines 21Ba.

Similarly, a two-stage branch structure is adopted in which access branch lines 21VBa orthogonal to the virtual voltage line segment 21V branch off from the virtual voltage line segment 21V and further the branch lines 21VB orthogonal to the access branch lines 21VBa branch off from the access branch lines 21VBa.

The total gate width (total length in the direction of length) of the switch transistors SWT controlled by the first switch control line 35_1 is set to be the same in FIGS. 8A and 8B and FIGS. 9A and 9B. Similarly, the total gate width of the switch transistors SWT controlled by the second switch control line 35_2 is set to be the same in FIGS. 8A and 8B and FIGS. 9A and 9B.

Each of the switch blocks 2U, 2D, 2R, and 2L has a buffer circuit BUF1 provided at an intermediate point of the first switch control line 35_1 and a buffer circuit BUF2 provided at an intermediate point of the second switch control line 35_2 on an opposite side (outside) of the switch arrangement region from the circuit block 1.

The buffer circuits BUF1 and BUF2 are connected to the real VDD line not shown in the figure and the voltage line segment 21 to thereby perform a function of shaping the waveform of the control signal attenuated in a process of being transmitted into that of a pulse signal having the amplitude of the power supply voltage VDD. Thus, a buffer circuit arrangement region represented by a broken line is provided on the outside of the switch arrangement region.

Wiring for switch control extends from each output of the buffer circuits BUF1 and BUF2 to the switch arrangement region, and is connected to the gate of a corresponding switch transistor group.

Incidentally, this wiring as well as the first switch control line 35_1 and the second switch control line 35_2 is represented by a line in FIGS. 8A and 8B and FIGS. 9A and 9B, but is actually formed by a wiring layer having a similar width to that of the voltage line segment 21 and the like.

The switch control line 35_1 and the second switch control line 35_2 each include, within the switch block, a "first control line segment" that is provided on the input side of the corresponding buffer circuit BUF1 or BUF2 and to which the control signal is input and a "second control line segment" that is provided on the output side of the corresponding buffer circuit BUF1 or BUF2 and to which the waveform-shaped control signal is output.

<Wiring Structure>

Figure 10:
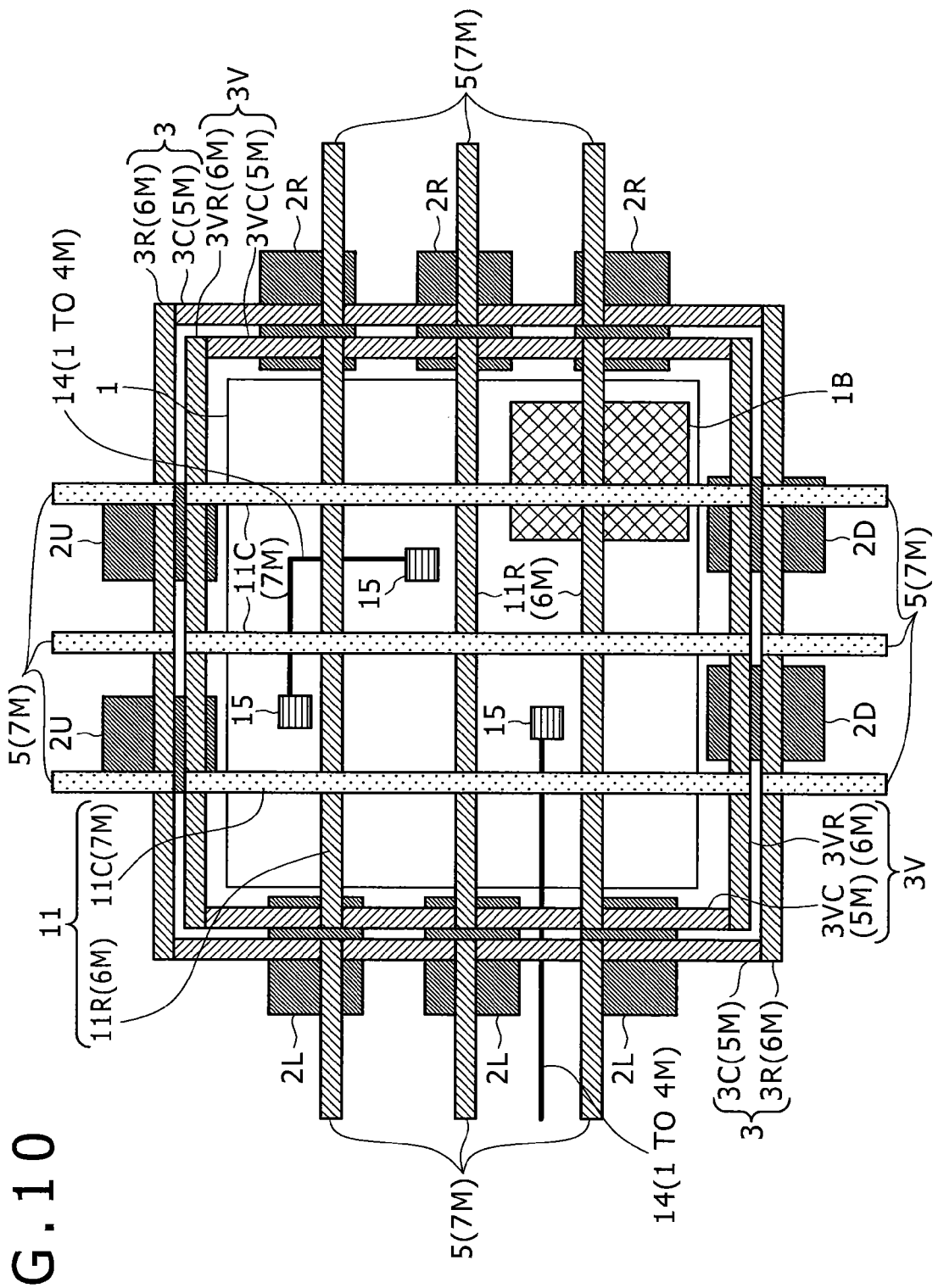
FIG. 10 is a diagram showing use conditions of wiring layers at respective levels in a multilayer wiring structure by references 1M to 7M.

FIG. 10 shows an example of use of wiring layers at respective levels in a multilayer wiring structure. In this case, each piece of wiring is formed using a wiring layer at a first level (a first wiring layer (1M)) to a wiring layer at a seventh level (a seventh wiring layer (7M)) laminated in order from the bottom layer in the multilayer wiring structure.

Specifically, wiring between standard cells 15 such as the inverter cell 13 (FIG. 2) and the like within the power shutoff object circuit block 1 is formed of the first wiring layer (1M) to the fourth wiring layer (4M). A signal line routed from a certain standard cell 15 to the outside is also formed of the first wiring layer (1M) to the fourth wiring layer (4M).

Wiring 3C in the column direction of the annular rail line 3 is formed of the fifth wiring layer (5M). Wiring 3R in the row direction of the annular rail line 3 is formed of the sixth wiring layer (6M) higher by one level than the fifth wiring layer (5M) and connected to both ends of the wiring 3C in the column direction.

Similarly, wiring 3VC in the column direction of the virtual annular rail line 3V is formed of the fifth wiring layer (5M). Wiring 3VR in the row direction of the virtual annular rail line 3V is formed of the sixth wiring layer (6M) higher by one level than the fifth wiring layer (5M) and connected to both ends of the wiring 3VC in the column direction.

Wiring 11R in the row direction of the internal voltage lines 11 is formed of the sixth wiring layer (6M) higher by one level than the fifth wiring layer (5M) to be connected to the wiring 3VC in the column direction of the virtual annular rail line 3V, the wiring 3VC being formed of the fifth wiring layer (5M). Further, the wiring 11R in the row direction of the internal voltage lines 11, the wiring 11R being formed of the sixth wiring layer (6M), is connected to wiring 11C in the column direction of the internal voltage lines 11, the wiring 11C being formed of the seventh wiring layer (7M) higher by one level than the sixth wiring layer (6M), at intersections of the wiring 11R and the wiring 11C.

Incidentally, the real VSS wiring 5 is also formed by the seventh wiring layer (7M).

Thus, inter-wiring connection is achieved well by forming wiring in the column direction out of wiring lower by one level than wiring in the row direction and applying this rule.

In the above description, the pattern of a switch cell is arbitrary and has not been mentioned. However, a switch cell having a biaxial symmetric pattern will next be described as a desirable concrete example.

Figure 11:
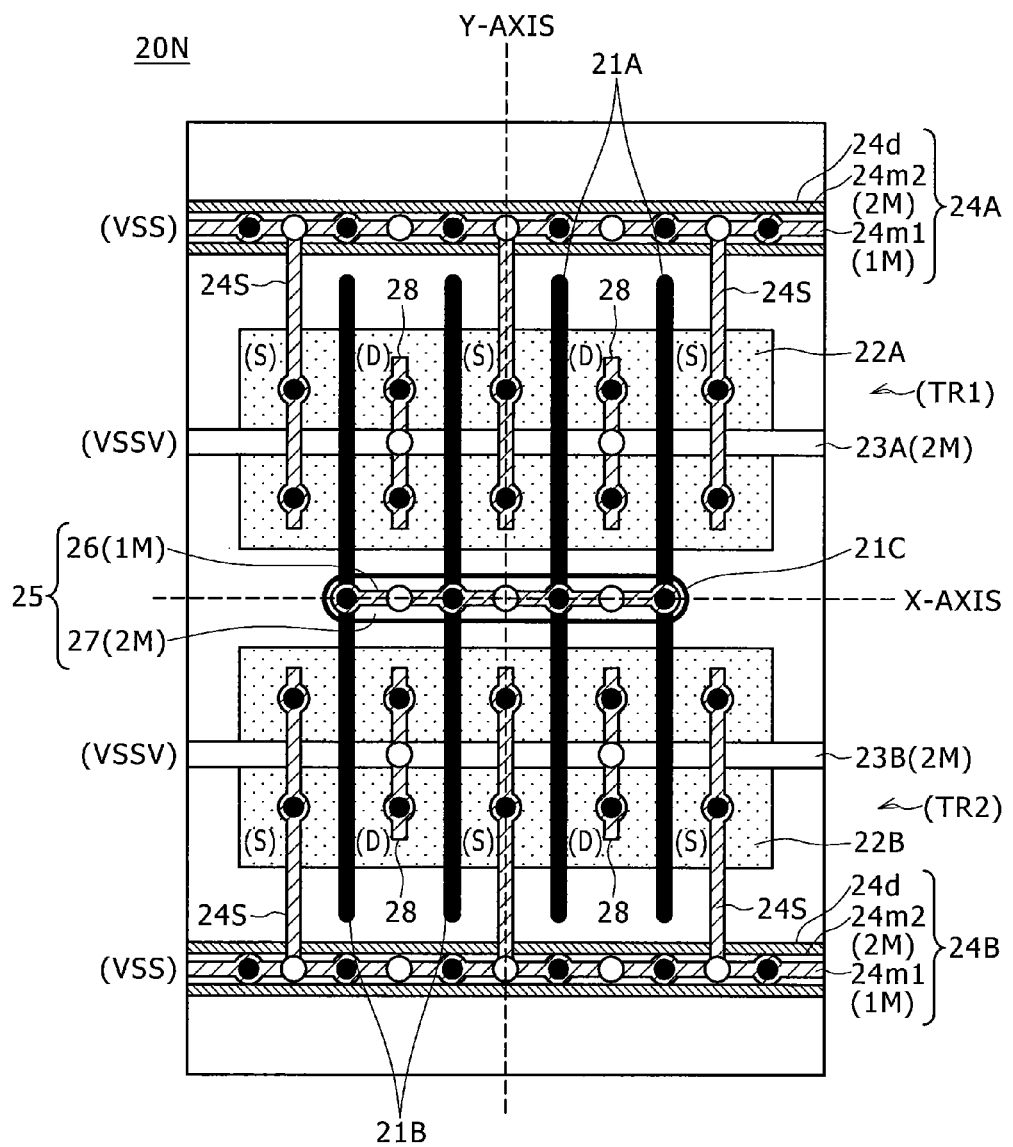
FIG. 11 is a schematic layout diagram of a switch cell according to the embodiment.

FIG. 11 is a schematic layout diagram of one switch cell. Incidentally, pattern size and the like in FIG. 11 are not equal to those of an actual switch cell, and FIG. 11 only schematically shows the rough arrangement and connecting relation of the pattern.

The switch cell 20N shown in FIG. 11 is formed by converting one NMOS transistor into a standard cell. The switch cell 20N has a configuration symmetric with respect to each of an X-axis and a Y-axis passing through the center of the cell. This symmetry will be referred to as "biaxial symmetry."

The entire region of the switch cell 20N illustrated in FIG. 11 forms a part of a P-well.

A gate electrode coupling part 21C passing through the center of the cell along the X-axis is formed. The lengths of the coupling part 21C from the center of the cell are the same (symmetric) with the Y-axis as a boundary. That is, the coupling part 21C has a pattern of biaxial symmetry.

Four gate electrodes 21A of a same length extend from the coupling part 21C on one side in a width direction of the coupling part 21C, and four gate electrodes 21B of the same length extend from the coupling part 21C on another side of the coupling part 21C. The four gate electrodes 21A are arranged at equal intervals in the direction of the X-axis. The four gate electrodes 21B are similarly arranged at equal intervals in the direction of the X-axis. Because the gate electrodes 21A and the gate electrodes 21B all have the same length and a same thickness, the gate electrodes 21A and the gate electrodes 21B are symmetric with respect to the Y-axis. Because the gate electrodes 21A and 21B branch off from the same positions of the coupling part 21C, the gate electrodes 21A and 21B are symmetric with respect to the X-axis. The coupling part 21C and the gate electrodes 21A and 21B are formed integrally with each other by treating a same conductive material.

Two N-type active regions 22A and 22B of a same size are formed in the P-well at equal distances from the X-axis. The N-type active region 22A is formed in a position in which the N-type active region 22A intersects the four gate electrodes 21A. The N-type active region 22B is formed in a position in which the N-type active region 22B intersects the four gate electrodes 21B. The N-type active regions 22A and 22B are formed by selectively introducing an N-type impurity into the P-well with the gate electrodes 21A and 21B as a mask after the gate electrodes 21A and 21B are formed.

The N-type active regions 22A and 22B are each divided by the parts of the gate electrodes into five regions alternately functioning as a source (S) and a drain (D).

Thereby, a basic structure having biaxial symmetry is formed which structure includes a first unit transistor (TR1) having the parts dividing the N-type active region 22A as a channel and a second unit transistor (TR2) having the parts dividing the N-type active region 22B as a channel.

In the region in which the first unit transistor (TR1) is disposed, a voltage cell line 23A formed of the second wiring layer (2M) is disposed so as to be orthogonal to the four gate electrodes 21A. Similarly, in the region in which the second unit transistor (TR2) is disposed, a voltage cell line 23B formed of the second wiring layer (2M) is disposed so as to be orthogonal to the four gate electrodes 21B.

The two voltage cell lines 23A and 23B are each a cell internal line electrically connected to an internal voltage line 11 within the circuit block 1 (see FIG. 2) by the virtual voltage line segment 21V (see FIG. 7) in a layer higher than the voltage cell lines 23A and 23B. That is, in terms of correspondence with FIG. 7, the two voltage cell lines 23A and 23B in FIG. 11 correspond to one branch line 21VB in FIG. 7.

Two drain lines 28 connected to two respective drains (D) via a 1st contact (1C) in each of the N-type active regions 22A and 22B are provided. The two drain lines 28 in each of the N-type active regions 22A and 22B or a total of four drain lines 28 are formed by the first wiring layer (1M).

The voltage cell line 23A is connected to the two drain lines 28 on the N-type active region 22A via a 2nd contact (2C). Similarly, the voltage cell line 23B is connected to the two drain lines 28 on the N-type active region 22B via a 2nd contact (2C).

The two voltage cell lines 23A and 23B are parallel with each other, and arranged at equal distances from the X-axis.

A power cell line 24A parallel with the voltage cell line 23A is disposed on a tip side of the four gate electrodes 21A. Similarly, a power cell line 24B parallel with the voltage cell line 23B is disposed on a tip side of the four gate electrodes 21B.

The power cell lines 24A and 24B are each a cell internal line electrically connected to the real VDD line (the voltage line segment 21 in FIG. 7) in a higher layer than the power cell lines 24A and 24B. That is, in terms of correspondence with FIG. 7, the two power cell lines 24A and 24B in FIG. 11 correspond to one branch line 21B in FIG. 7.

The two power cell lines 24A and 24B each include a wiring region 24d formed simultaneously with a P-type active region not shown in the figure and the like, first lining wiring 24m1 formed of the first wiring layer (1M), and second lining wiring 24m2 formed of the second wiring layer (2M).

In each of the two power cell lines 24A and 24B, the wiring region 24d and the first lining wiring 24m1 are short-circuited by a 1st contact (1C) at equal intervals, and the first lining wiring 24m1 and the second lining wiring 24m2 are short-circuited by a 2nd contact (2C) at equal intervals.

The first lining wiring 24m1 forming the power cell line 24A is formed integrally with two source lines 24S extending on two source (S) sides of the N-type active region 22A. Similarly, the first lining wiring 24m1 forming the power cell line 24B is formed integrally with two source lines 24S extending on two source (S) sides of the N-type active region 22B.

The sources (S) are connected to the source lines 24S via a 1st contact (1C).

In this case, the gate electrode coupling part 21C described first can be omitted, and is replaceable by four contact pad parts.

In either case, as a whole, the four gate electrodes formed by the gate electrodes 21A and 21B parallel with the Y-axis are short-circuited by a wiring layer higher than the gate electrodes. Cell internal wiring short-circuiting the gate electrodes will be referred to as a "control cell line."

The control cell line 25 in the present example is formed by superimposing a second control cell line 27 formed of the second wiring layer (2M) on a first control cell line 26 formed of the first wiring layer (1M). The coupling part 21C (or the four contact pad parts) and the first control cell line 26 are connected to each other by a 1st contact (1C). The first control cell line 26 and the second control cell line 27 are connected to each other by a 2nd contact (2C).

The control cell line 25 is disposed along the X-axis with the centers in the direction of width and the direction of length of the control cell line 25 coinciding with the center of the cell.

Thus, the control cell line 25 is disposed in parallel with each of the two voltage cell lines 23A and 23B and the two power cell lines 24A and 24B.

FIG. 12 shows a switch cell 20P of a PMOS transistor.

The switch cell 20P illustrated in FIG. 12 differs from the switch cell 20N of FIG. 11 in that the whole of the switch cell 20P is formed in an N-well and the active regions of a first unit transistor (TR1) and a second unit transistor (TR2) formed in the N-well are P-type active regions 22AP and 22BP. Other configuration is the same as in FIG. 11. Therefore, the same reference numerals are provided to the other configuration, and description thereof will be omitted.

Figure 13A:
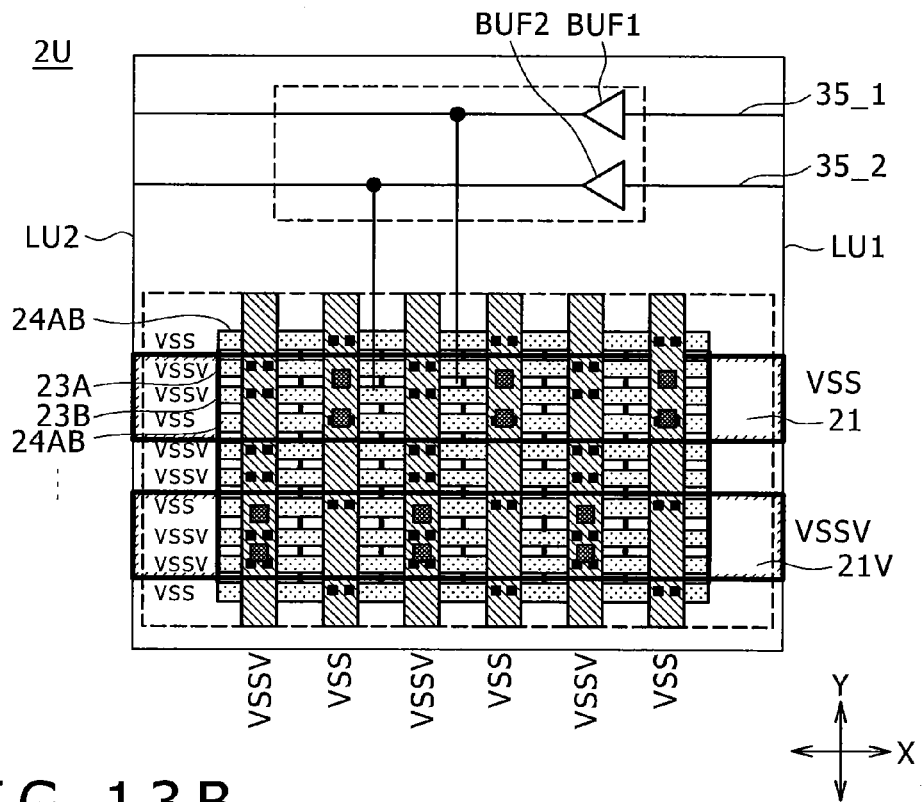
FIGS. 13A and 13B relate to the embodiment, FIG. 13A being a diagram of a configuration of an upper switch block formed using the switch cell of FIG. 11, and FIG. 13B being a diagram of a configuration of a lower switch block.
Figure 13B:
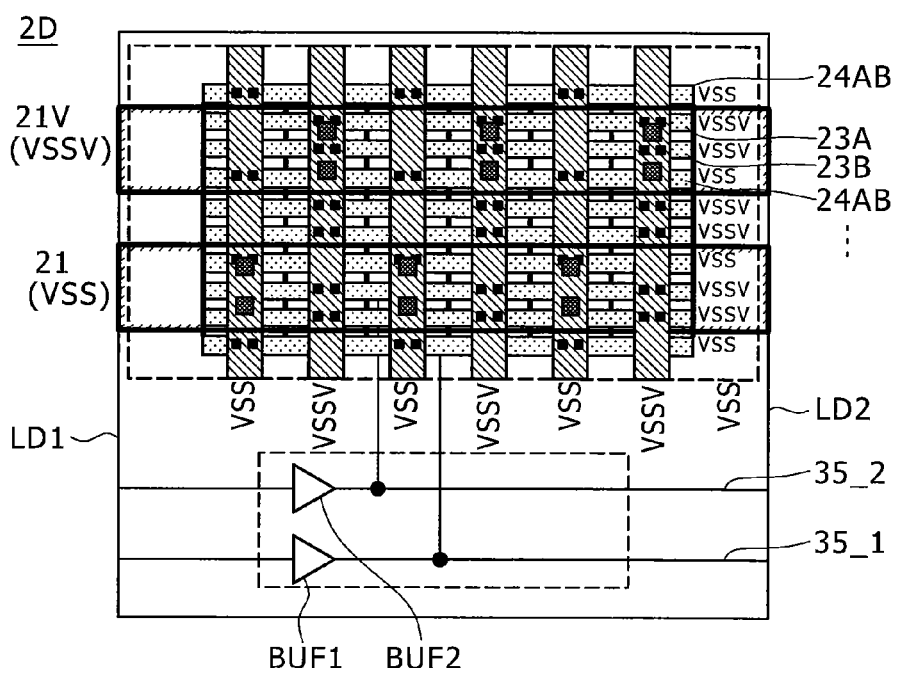
Figure 14A:
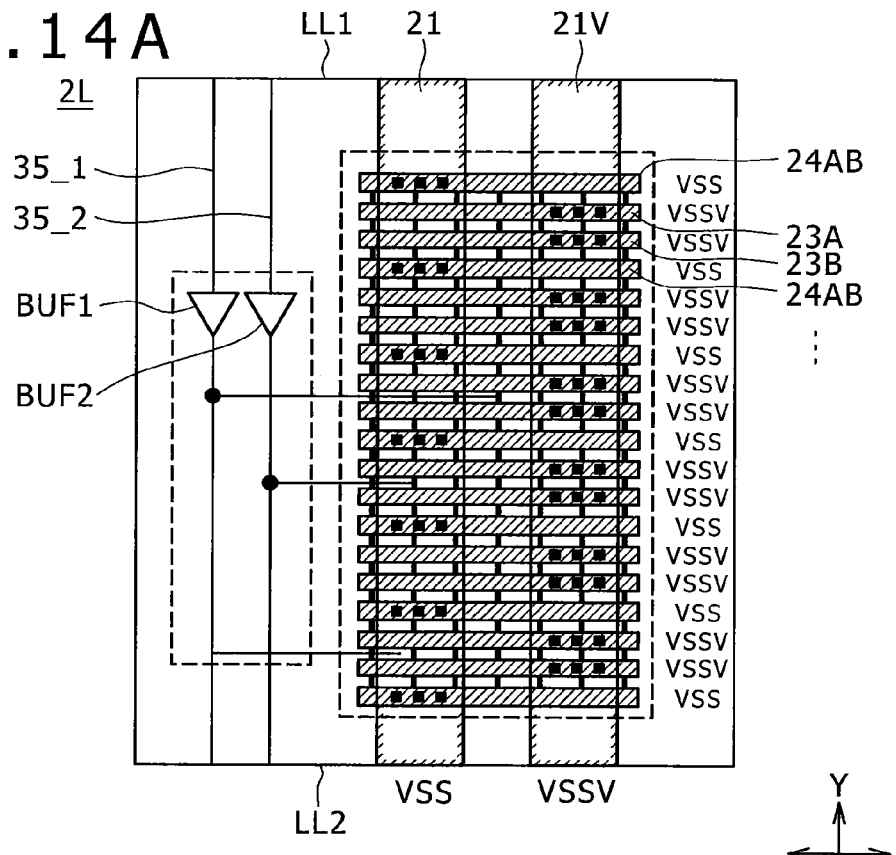
FIGS. 14A and 14B relate to the embodiment, FIG. 14A being a diagram of a configuration of a left switch block formed using the switch cell of FIG. 11, and FIG. 14B being a diagram of a configuration of a right switch block.
Figure 14B:
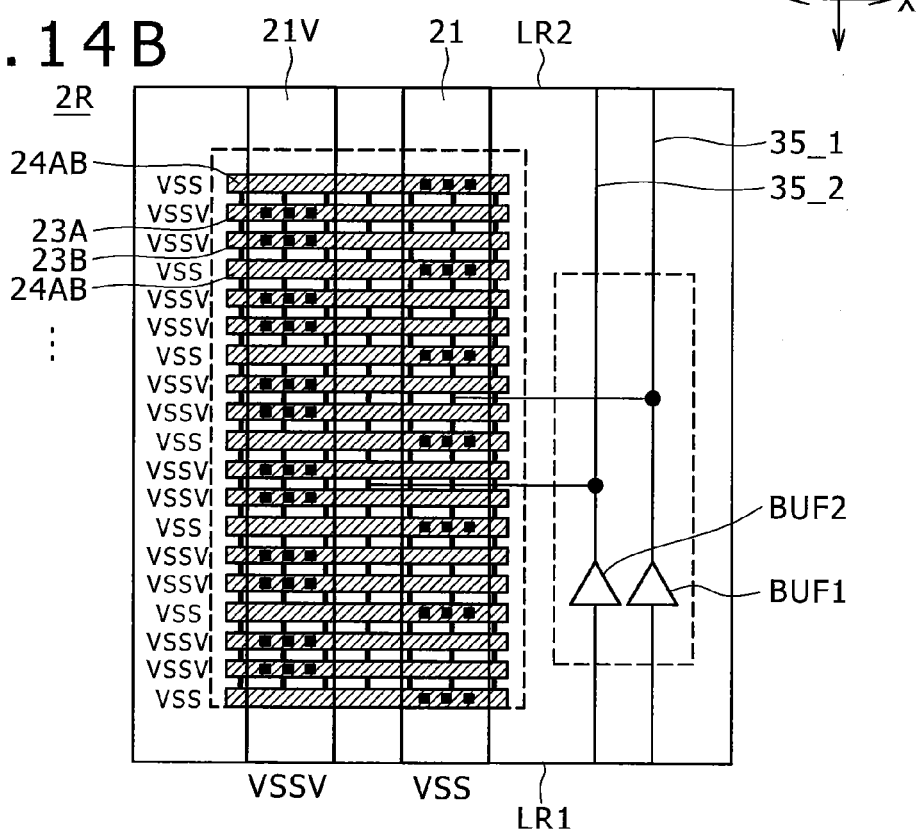

FIGS. 13A and 13B are diagrams of configuration of an upper switch block 2U and a lower switch block 2D using the switch cell 20N of the NMOS transistor configuration in FIG. 11. FIGS. 14A and 14B are diagrams of configuration of a left switch block 2L and a right switch block 2R similarly using the switch cell 20N.

A comparison of FIGS. 13A and 13B and FIGS. 14A and 14B with FIGS. 8A and 8B and FIGS. 9A and 9B shows that power cell lines 24AB corresponding to the branch lines 21B in FIGS. 8A and 8B and FIGS. 9A and 9B are formed at twice the density of the branch lines 21B and that voltage cell lines 23A and 23B corresponding to the branch lines 21VB in FIGS. 8A and 8B and FIGS. 9A and 9B are formed at twice the density of the branch lines 21VB. In this case, a power cell line 24AB is shared by the power cell line 24A in FIG. 11 and the power cell line 24B of another cell adjacent in the Y-direction.

Other configuration is common, and therefore description thereof will be omitted.

Though not shown in FIGS. 13A and 13B and FIGS. 14A and 14B, a multilayer wiring structure is used to connect a predetermined number of switch cells 20N at predetermined positions to each of the first switch control line 35_1 and the second switch control line 35_2. When wiring layers are increased in number, the switch control lines can be arranged symmetrically with respect to the center of the blocks. It is not desirable, however, to complicate the wiring structure and thus increase manufacturing cost only for this purpose. In addition, in the present example, from a need to dispose the buffer circuits BUF1 and BUF2, it is necessary to arrange the first switch control line 35_1 and the second switch control line 35_2 asymmetrically with respect to the center of the switch blocks.

Description will next be made of advantages of the symmetric wiring structure of switch cells when the switch control lines thus may not be arranged symmetrically with respect to the center of the blocks.

Description will first be made of the ease of design of switch blocks as a first advantage.

A preferable switch arrangement wiring method (switch block designing method) in the present embodiment follows the following procedure utilizing layout symmetry of the switch cell 20N.

First step: Transistors are arranged, and each of two voltage cell lines 23A and 23B to be each electrically connected to internal voltage lines 11, two power cell lines 24A and 24B (or two shared power cell lines 24AB) to be each electrically connected to a second power supply line to which the power supply voltage VDD (in the case of the switch cell 20P) or the reference voltage VSS (in the case of the switch cell 20N) is applied, and a control cell line 25 to be electrically connected to switch control lines 29A to 29C is arranged symmetrically with respect to each of the X-axis and the Y-axis passing through the center of the cell, and is connected to the transistors. Thereby the switch cell 20N or 20P (or both thereof) is formed.

Second step: Formed switch cells 20N or 20P (or both thereof) are arranged in the form of a matrix. Predetermined switch cells 20N or 20P (or both thereof) are connected to each of the plurality of switch control lines 29A to 29C. Thereby a switch block 20 is formed.

Third step: Created data on the switch block 2 is mirror-inverted on a line parallel to the X-axis or the Y-axis, or rotated by 180 degrees (inverted by 180 degrees) on a cell center. Thereby an inverted switch block is formed.

Fourth step: The plurality of switch control lines 29A to 29C and the second power supply line are connected between the disposed switch block and the inverted switch block. The voltage cell lines 23A and 23B are connected to the internal voltage lines 11 of the circuit block 1.

Making description more specifically, though the description is a repetition, the control cell line 25, the voltage cell lines 23A and 23B, and the power cell lines 24A and 24B (or the two power cell lines 24AB) are symmetric with respect to each of the X-axis and the Y-axis. Thus, even when the switch cell 20N is mirror-inverted with a line along the X-axis or the Y-axis as an inversion axis or rotated by 180 degrees on a cell center, positional relation between the five cell lines described above remains in the original state.

In the case of FIG. 5 in which even transistors are arranged biaxially symmetrically, in particular, even when the whole of a certain switch block 2 is mirror-inverted or rotated by 180 degrees in a stage in which design up to switch control lines is made as in FIG. 4, for example, the basic pattern of each switch cell 20N as shown in FIG. 11 in a switch cell group in the form of a matrix is not changed at all. A change is made to the switch control lines 29A to 29C and connecting lines thereof, which are not arranged symmetrically within the block and are formed by the third wiring layer (3M) and higher wiring layers.

Wiring between blocks is easy when the distance of each of the first switch control line 35_1 and the second switch control line 35_2 from the circuit block 1 is the same. In addition, there is often a restriction demanding that the orientation (direction of length) of the gates of transistors be the same within an integrated circuit for uniform characteristics. In such a case, switch blocks arranged on the four sides of the circuit block 1 have a different pattern for each side.

However, when switch cells as shown in FIG. 11 are used, in which switch cells the five cell lines, that is, the voltage cell lines 23A and 23B, the power cell lines 24A and 24B, and the control cell line 25 have biaxial symmetry, switch blocks can be designed easily by the method having the procedure of the first to fifth steps described above.

Utilizing the fact that the relation between the five cell lines is not changed in consequence of mirror inversion or 180-degree rotation and wiring in higher layers than the cell lines is changed, after one switch block 2 to be disposed on one side of two opposed sides of the circuit block 1 is designed in the first and second steps, data on the switch block 2 after the design is mirror-inverted on a line parallel to the two sides or rotated by 180 degrees. Thereby data on another switch block 2 to be disposed on the other side can be created easily (the third step).

Similarly, for the other two sides, after a switch block 2 to be disposed on one of the sides is designed in the first and second steps, data after the design is mirror-inverted or rotated by 180 degrees (the third step). Thereby data on a switch block 2 to be disposed on the other side can be created easily.

Each of the switch control lines 29A to 29C in the four kinds of switch blocks (2U, 2D, 2L, and 2R) thus created have the same distance to the circuit block 1. It is therefore easy to connect the switch control lines between blocks in the fourth step. In addition, this is true for other wiring to be connected between switch blocks.

Description will next be made of the ease of switch cell design itself.

When even the pattern of transistors has biaxial symmetry as in FIG. 11 and FIG. 12 in addition to the symmetry of the five cell lines, one of patterns of a first to a fourth quadrant divided by the X-axis and the Y-axis (which patterns will hereinafter be referred to as quarter divided patterns) is designed, and thereafter the other three quarter divided patterns are formed by merely copying pattern data after the design and pasting the pattern data while performing mirror inversion or a combination of mirror inversion and 180-degree rotation. Thereby the design of a switch cell is completed.

Thus, a switch cell can be designed very easily. In addition, when high-density design is made such that a maximum gate width can be secured in a stage of the first design of a quarter divided pattern, a switch cell can be designed without a waste.

According to the present embodiment, the following benefits are obtained.

A plurality of switch blocks arranged around a power shutoff object circuit block 1 have a switch and a voltage line segment as a part of an annular rail line to which power supply voltage or reference voltage is applied. Thus, a switch segment can be, as it were, freely moved along the annular rail line, newly inserted, or deleted easily by merely moving, inserting, or deleting the switch block in a state in which positional relation between the voltage line segment and the switch is fixed.

Figure 15:
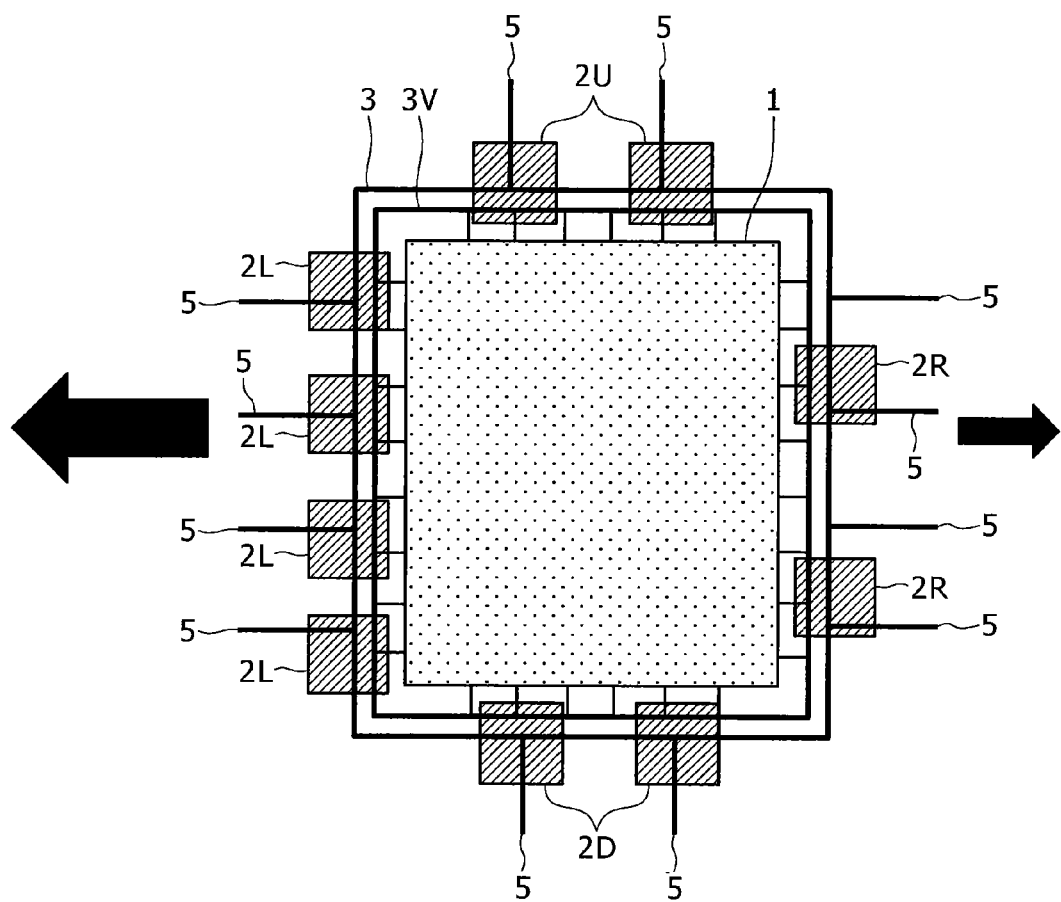
FIG. 15 is a diagram showing an appropriate arrangement of switch blocks in the embodiment.

In particular, as shown in FIG. 15, a plurality of switch blocks are arranged such that the lower the impedance of wiring (specifically the real VSS wiring 5 and the annular rail line 3 in the description of the present embodiment) supplying the power supply voltage or the reference voltage to the power shutoff object circuit block 1 as viewed from each of four sides of the circuit block 1, the higher the number of switch blocks.

In FIG. 15, the impedance of a side indicated by a thick arrow is lower than that of a side indicated by a thin arrow. That is, because input-output cells 40 shown in FIG. 1 are arranged on the side of the thick arrow, the external reference voltage assumes a value of approximately 0 [V]. On the other hand, because another circuit block (for example the energized circuit block 32) operating at all times is disposed on the side indicated by the thin arrow, a time average of the potential of a real VSS line is higher than 0 [V].

In such a case, when many switch blocks are disposed on the side where the reference voltage is fixed at 0 [V], the discharging of internal voltage lines 11 progresses more efficiently within a same switch-on time. On the other hand, when many switches are disposed on the side where the reference voltage is higher than 0 [V], the number of switch blocks needs to be increased to obtain the same discharging effect, thus leading to wastefulness.

The present embodiment has an effect of enabling such an efficient switch block arrangement to be made easily.

Specifically, provisions can be made at a time of determining power consumption in a latter half of design, and the number of switch blocks being used can be reduced as compared with the existing case. When the total gate width of switch transistors is reduced by decreasing the number of switch blocks, a leakage current is correspondingly decreased, so that a power reduction effect is obtained. In addition, because there is no operating circuit block on the side of the input-output cells 40, there is a small effect of power supply noise due to a discharge, and an adverse effect on the operating speed of other circuit blocks can be suppressed.

In addition, because the annular line to which the power supply voltage or the reference voltage is applied can be disposed so as to be superimposed on the switch, a great effect of area reduction is obtained.

Further, when switch cells having the biaxially symmetric pattern are used, the first advantage (the ease of switch block design) and the second advantage (the ease of switch cell design itself) described above are obtained.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit comprising:
a first electrode line in a line wiring layer;
a first internal voltage line in a layer different from the line wiring layer;
a first switch that provides an electrical connection and disconnection between the first electrode line and the first internal voltage line; and
a first buffer circuit electrically connected to the first switch,
wherein first switch transistors are in the first switch, an output of the first buffer is input to at least one of the first switch transistors,
wherein the first switch includes a first group of the switch transistors and second group of the switch transistors, a first control line being configured to control the first group and a second control line being configured to control the second group.

2. A semiconductor integrated circuit comprising:
a first electrode line in a line wiring layer;
a first internal voltage line in a layer different from the line wiring layer;
a first switch that provides an electrical connection and disconnection between the first electrode line and the first internal voltage line, the first switch is in a first switch arrangement region of the semiconductor integrated circuit;
a first buffer circuit electrically connected to the first switch, the first buffer circuit is in a first buffer circuit arrangement region of the semiconductor integrated circuit;
a second switch that provides an electrical connection and disconnection between a second electrode line and a second internal voltage line, the second switch is in a second switch arrangement region of the semiconductor integrated circuit; and
a second buffer circuit electrically connected to the second switch, the second buffer circuit is in a second buffer circuit arrangement region of the semiconductor integrated circuit,
wherein the first buffer circuit arrangement region is disposed outside the first switch arrangement region opposite from a circuit block along a first direction,
wherein the second buffer circuit arrangement region is disposed outside the second switch arrangement region opposite from the circuit block along a second direction that differs from the first direction, and
wherein the first switch includes a first group of switch transistors and a second group of the switch transistors, a first control line being configured to control the first group and a second control line being configured to control the second group.

3. The semiconductor integrated circuit according to claim 2, wherein the circuit block includes a first circuit block and a second circuit block, and the first circuit block is electrically connected to the first internal voltage line.

4. The semiconductor integrated circuit according to claim 3, wherein the second circuit block is electrically connected to the second internal voltage line.

5. The semiconductor integrated circuit according to claim 2, wherein the first group of the switch transistors is in the first switch.

6. The semiconductor integrated circuit according to claim 5, wherein the switch transistors in the first group are controllable by the first control line.

7. The semiconductor integrated circuit according to claim 2, wherein the second switch includes a third group of the switch transistors and a fourth group of the switch transistors, a third control line being configured to control the third group and a fourth control line being configured to control the forth group.

8. The semiconductor integrated circuit according to claim 7, wherein the switch transistors in the second group are controllable by the second control line.

9. The semiconductor integrated circuit according to claim 8, wherein the second electrode line extends in a direction that is different from the second direction.

10. The semiconductor integrated circuit according to claim 9, wherein the second electrode line extends in the first direction.

11. The semiconductor integrated circuit according to claim 2, wherein the switch transistors in the first group are connected to the first electrode line, the switch transistors in the second group are connected to the first internal voltage line.

12. The semiconductor integrated circuit according to claim 11, wherein an output of the first buffer is input to all of gates of the switch transistors in the first group.

13. The semiconductor integrated circuit according to claim 12, wherein the first electrode line overlaps the first switch arrangement region.

14. The semiconductor integrated circuit according to claim 13, wherein the output of the first buffer circuit is connected to the first control line.

15. The semiconductor integrated circuit according to claim 14, wherein the first electrode line extends in the second direction.

16. The semiconductor integrated circuit according to claim 15, wherein the gates of the switch transistors in the first group extend in a direction different from the second direction.

17. The semiconductor integrated circuit according to claim 16, wherein drain regions of the switch transistors in the first group are between the gates of the switch transistors in the first group.

18. The semiconductor integrated circuit according to claim 17, wherein the gates of the switch transistors in the first group are between source regions of the switch transistors in the first group.

19. The semiconductor integrated circuit according to claim 18, wherein the source regions of the switch transistors in the first group are connected to the first electrode line.

20. The semiconductor integrated circuit according to claim 19, wherein the first electrode line is electrically connected to the second electrode line.

21. The semiconductor integrated circuit according to claim 20, further comprising:
   a connecting portion electrically connecting the first electrode line to the second electrode line, the connecting portion being in a layer different from the first electrode line.

22. The semiconductor integrated circuit according to claim 2, wherein a third switch is connected to the first electrode line, the third switch is in the first switch arrangement region of the semiconductor integrated circuit, the third switch and the first switch are aligned along the second direction.

\* \* \* \* \*